US007920010B2

(12) United States Patent
Chen, Jr. et al.

(10) Patent No.: US 7,920,010 B2
(45) Date of Patent: Apr. 5, 2011

(54) SIGNAL ISOLATORS USING MICRO-TRANSFORMERS

(75) Inventors: Baoxing Chen, Jr., Westford, MA (US); Geoffrey Haigh, Boxford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/615,815

(22) Filed: Nov. 10, 2009

(65) Prior Publication Data

US 2010/0134139 A1 Jun. 3, 2010

Related U.S. Application Data

(63) Continuation of application No. 12/005,675, filed on Dec. 27, 2007, now Pat. No. 7,683,654, which is a continuation of application No. 11/481,997, filed on Jul. 6, 2006, now Pat. No. 7,692,444, which is a continuation of application No. 10/834,959, filed on Apr. 29, 2004, now Pat. No. 7,075,329.

(60) Provisional application No. 60/466,602, filed on Apr. 30, 2003.

(51) Int. Cl.
*H03L 5/00* (2006.01)
*H04B 3/00* (2006.01)

(52) U.S. Cl. ........ 327/307; 327/306; 327/510; 327/564; 326/21; 375/258; 375/358

(58) Field of Classification Search .............. 326/21–24; 327/510, 564; 375/257, 258, 219; 363/17; 257/531

See application file for complete search history.

(56) References Cited

U.S. PATENT DOCUMENTS

| 3,058,078 | A | 10/1962 | Hoh |
| 3,537,022 | A | 10/1970 | Regan |
| 3,714,540 | A | 1/1973 | Galloway |
| 3,760,198 | A | 9/1973 | Mori et al. |
| 3,798,608 | A | 3/1974 | Huebner |
| 3,808,673 | A | 5/1974 | Bottini |

(Continued)

FOREIGN PATENT DOCUMENTS

DE 2529296 A1 1/1977

(Continued)

OTHER PUBLICATIONS

U.S. Appl. No. 09/872,779, published Feb. 14, 2002, entitled "Isolator for Transmitting Logic Signals Across an Isolation Barrier", unknown date, pp. AD1000363-AD1000376.

(Continued)

*Primary Examiner* — Vibol Tan
(74) *Attorney, Agent, or Firm* — Kenyon & Kenyon LLP

(57) ABSTRACT

A logic signal isolator comprising a transformer having a primary winding and a secondary winding; a transmitter circuit which drives said primary winding in response to a received logic signal, such that in response to a first type of edge in the logic signal, a signal of a first predetermined type is supplied to the primary winding and in response to a second type of edge in the logic signal, a signal of a second predetermined type is supplied to said primary winding, the primary winding and the transmitter being referenced to a first ground; and the secondary winding being referenced to a second ground which is galvanically isolated from the first ground and said secondary winding supplying to a receiver circuit signals received in correspondence to the signals provided to the primary winding, the receiver reconstructing the received logic signal from the received signals.

8 Claims, 10 Drawing Sheets

U.S. PATENT DOCUMENTS

| | | |
|---|---|---|
| 4,024,452 A | 5/1977 | Seidel |
| 4,027,152 A | 5/1977 | Brown et al. |
| 4,118,603 A | 10/1978 | Kumhyr |
| 4,159,431 A | 6/1979 | Roozenbeek et al. |
| 4,227,045 A | 10/1980 | Chelcun et al. |
| 4,275,404 A | 6/1981 | Cassiday et al. |
| 4,302,807 A | 11/1981 | Mentler |
| 4,538,136 A | 8/1985 | Drabing |
| 4,547,961 A | 10/1985 | Bokil et al. |
| 4,660,014 A | 4/1987 | Wenaas et al. |
| 4,703,283 A | 10/1987 | Samuels |
| 4,748,419 A | 5/1988 | Somerville |
| 4,780,795 A | 10/1988 | Meinel |
| 4,785,345 A | 11/1988 | Rawls et al. |
| 4,817,865 A | 4/1989 | Wray |
| 4,818,855 A | 4/1989 | Mongeon et al. |
| 4,825,450 A | 4/1989 | Herzog |
| 4,835,486 A | 5/1989 | Somerville |
| 4,859,877 A | 8/1989 | Cooperman et al. |
| 4,885,582 A | 12/1989 | LaBarge et al. |
| 4,922,883 A | 5/1990 | Iwasaki |
| 4,924,210 A | 5/1990 | Matsui et al. |
| 4,937,468 A | 6/1990 | Shekhawat et al. |
| 4,945,264 A | 7/1990 | Lee et al. |
| 4,959,631 A | 9/1990 | Hasegawa et al. |
| 5,041,780 A | 8/1991 | Rippel |
| 5,057,968 A | 10/1991 | Morrison |
| 5,095,357 A | 3/1992 | Andoh et al. |
| 5,102,040 A | 4/1992 | Harvey |
| 5,128,729 A | 7/1992 | Alonas et al. |
| 5,142,432 A | 8/1992 | Schneider |
| 5,164,621 A | 11/1992 | Miyamoto |
| 5,204,551 A | 4/1993 | Bjornholt |
| 5,270,882 A | 12/1993 | Jove et al. |
| 5,293,400 A | 3/1994 | Monod et al. |
| 5,334,882 A | 8/1994 | Ting |
| 5,353,001 A | 10/1994 | Meinel et al. |
| 5,369,666 A | 11/1994 | Folwell et al. |
| 5,384,808 A | 1/1995 | Van Brunt et al. |
| 5,396,394 A | 3/1995 | Gee |
| 5,467,607 A | 11/1995 | Harvey |
| 5,469,098 A | 11/1995 | Johnson, Jr. |
| 5,484,012 A | 1/1996 | Hiratsuka |
| 5,533,054 A | 7/1996 | DeAndrea et al. |
| 5,539,241 A | 7/1996 | Abidi et al. |
| 5,539,598 A | 7/1996 | Denison et al. |
| 5,572,179 A | 11/1996 | Ito et al. |
| 5,588,021 A | 12/1996 | Hunt et al. |
| 5,596,466 A | 1/1997 | Ochi |
| 5,650,357 A | 7/1997 | Dobkin et al. |
| 5,701,037 A | 12/1997 | Weber et al. |
| 5,714,938 A | 2/1998 | Schwabl |
| 5,716,323 A | 2/1998 | Lee |
| 5,731,954 A | 3/1998 | Cheon |
| 5,774,791 A | 6/1998 | Strohallen et al. |
| 5,781,071 A | 7/1998 | Kusunoki |
| 5,781,077 A | 7/1998 | Leitch et al. |
| 5,786,979 A | 7/1998 | Douglass |
| 5,801,602 A | 9/1998 | Fawal et al. |
| 5,812,598 A | 9/1998 | Sharma et al. |
| 5,825,259 A | 10/1998 | Harpham |
| 5,831,426 A | 11/1998 | Black et al. |
| 5,831,525 A | 11/1998 | Harvey |
| 5,877,667 A | 3/1999 | Wollensen |
| 5,900,683 A | 5/1999 | Rinehart et al. |
| 5,926,358 A | 7/1999 | Dobkin et al. |
| 5,942,937 A | 8/1999 | Bell |
| 5,952,849 A | 9/1999 | Haigh |
| 5,969,590 A | 10/1999 | Gutierrez |
| 5,990,753 A | 11/1999 | Danstrom et al. |
| 6,054,780 A | 4/2000 | Haigh et al. |
| 6,069,802 A | 5/2000 | Priegnitz |
| 6,087,882 A | 7/2000 | Chen et al. |
| 6,104,003 A | 8/2000 | Jones |
| 6,124,756 A | 9/2000 | Yaklin et al. |
| 6,262,600 B1 | 7/2001 | Haigh et al. |
| 6,291,907 B1 | 9/2001 | Haigh et al. |
| 6,501,363 B1 | 12/2002 | Hwu et al. |
| 6,525,566 B2 | 2/2003 | Haigh et al. |
| 6,686,768 B2 | 2/2004 | Comer |
| 6,720,816 B2 * | 4/2004 | Strzalkowski ............... 327/307 |
| 6,728,320 B1 | 4/2004 | Khasnis et al. |
| 6,873,065 B2 | 3/2005 | Haigh et al. |
| 6,903,578 B2 | 6/2005 | Haigh et al. |
| 6,911,860 B1 | 6/2005 | Wang et al. |
| 6,922,080 B2 | 7/2005 | Haigh et al. |
| 6,927,662 B2 | 8/2005 | Kahlmann et al. |
| 7,075,329 B2 | 7/2006 | Chen et al. |
| 7,376,212 B2 | 5/2008 | Dupuis |
| 7,489,526 B2 | 2/2009 | Chen et al. |
| 2003/0042571 A1 | 3/2003 | Chen et al. |
| 2005/0272378 A1 | 12/2005 | Dupuis |
| 2007/0258513 A1 | 11/2007 | Strzalkowski |

FOREIGN PATENT DOCUMENTS

| | | |
|---|---|---|
| DE | 19718420 A1 | 11/1998 |
| DE | 19922129 C1 | 9/2000 |
| DE | 19922123 A1 | 11/2000 |
| DE | 19922127 A1 | 11/2000 |
| DE | 19922128 C1 | 1/2001 |
| DE | 19922127 C2 | 5/2002 |
| EP | 0282102 A2 | 9/1988 |
| EP | 307345 A1 | 3/1989 |
| EP | 0586062 A1 | 3/1994 |
| EP | 917309 A2 | 5/1999 |
| EP | 977406 A1 | 2/2000 |
| FR | 2679670 | 7/1991 |
| GB | 2173956 A | 10/1986 |
| JP | 57132460 | 2/1981 |
| JP | 58215833 | 12/1983 |
| WO | 95/20768 | 8/1995 |
| WO | 98/37672 | 8/1998 |
| WO | 98/48541 | 10/1998 |
| WO | 99/21332 | 4/1999 |
| WO | 01/28094 | 4/2001 |
| WO | 01/61951 | 8/2001 |
| WO | 02/073914 | 9/2002 |
| WO | 02/086969 | 10/2002 |

OTHER PUBLICATIONS

Claims Chart, "U.S. Patent No. 6,262,600, issued Jul. 17, 2001, in view of Japanese Patent No. 57-132460, published Aug. 16, 1982 to Inanari", pp. 1-4.

Claims Chart, "U.S. Patent No. 6,262,600, issued Jul. 17, 2001 in view of U.S. Patent No. 5,650,357, Issued Jul. 22, 1997 to Dobkin", pp. 1-5.

Gediminas P. Kurpis, Chair, "The New IEEE Standard Dictionary of Electrical and Electronics Terms [Including Abstracts of All Current IEEE Standards]," IEEE St. 100-1992, Fifth Edition, date unknown.

U.S. District Court for the District of Massachusetts, *Analog Devices Inc.* v. *Silicon Laboratories, Inc.*, Civil Action No. 06-12240(WGY), Plaintiff Analog Devices, Inc.'s Responses and Objections to Defendant's Third Set of Interrogatories, Cover Sheet, (unnumbered) pp. 10, 11, and Objections, date unknown.

30(b)(6) Deposition of Timothy J. Dupuis, United States District Court in the District of Massachusetts, *Analog Devices, Inc.* vs. *Silicon Laboratories, Inc.*, Civil Action No. 06-12240 (WGY) Oral and Videotaped Deposition of Timothy J .Dupuis-30(B)(6) Oct. 24, 2007, LiveNote World Service, p. 1, 62, 63, 204.

"Preliminary Amendment", mailed Oct. 12, 2001, Isolator for Transmitting Logic Signals Across an Isolation Barrier, U.S. Appl. No. 09/872,779 published Feb. 25, 2003, 8 pgs. (unnumbered).

"Office Action", U.S. Appl. No. 09/872,779 ( published Feb. 14, 2002), mailed Apr. 24, 2002, 2 Cover Sheets (unnumbered), pp. 2-7.

"Amendment" Isolator for Transmitting Logic Signals Across an Isolation Barrier, U.S. Appl. No. 09/872,779 (published Feb. 14, 2002), Jul. 30, 2002, pp. 1-10.

"Notice of Allowability", U.S. Appl. No. 09/872,779 (published Feb. 14, 2002), mailed Feb. 14, 2002 Cover Sheet (unnumbered), pp. 2-3.

Plaintiff Analog Devices, Inc.'s Preliminary Infringement Contentions, May 25, 2007, pp. 1-7.

U.S. District Court of Massachusetts, *Analog Devices, Inc.* vs. *Silicon Laboratories, Inc.*, Civil Action No. 06-12240(WGY) , "Silicon Labs' Memorandum of Law in Support of It's Motion for Summary Judgment as to Count II Seeking Summ. Judg of Invalidity of . . . ," Cover Sheet, Table of Contents (unnumbered), p. ii-iii, Introduction (unnumbered), pp. 1-21, cited Jul. 16, 2007.

U.S. District Court District of Massachusetts, *Analog Devices Inc.* vs. *Silicon Laboratories Inc.*, Civil Action No. 06-12240(WGY), "Silicon Labs' Motion for Summary Judgment as to Count II Seeking Summ. Judg. of Invalidity of the Asserted Claims . . . ," p. 1-4, cited Jul. 16, 2007.

U.S. District Court District of Massachusetts, *Analog Devices, Inc.* vs. *Silicon Laboratories, Inc.*, Civil Action No. 06-12240(WGY), "Motion to Withdraw", 3 pages (unnumbered), cited Dec. 14, 2007.

United States District Court Tyler Division, *Analog Devices, Inc.* v. *Silicon Laboratories Inc.*, Civil Action No. 06-12240(WGY) Declaration of Nicholas A. Schuneman in Support of Defendant's Motion for Summ. Judg. as to Count II, Cover Sheet (unnumbered), pp. 2-5, cited Dec. 14, 2007.

U.S. District Court District of Massachusetts, *Analog Devices, Inc.* vs. *Silicon Laboratories, Inc.*, Civil Action No. 06-12240(WGY) Silicon Labs' Statement of Facts Support of Its Motion for Summary Judgment as to Count II, Cover Sheet (unnumbered), pp. 1-28, date unknown.

U.S. District Court in the District of Massachusetts, *Analog Devices Inc.* v. *Silicon Laboratories Inc.* Civil Action No. 06-12240(WGY) "Analog Devices' Counter-Statement of Facts Pursuant to Local Rule 56.1 in Support of Its Opp. to Silicon Labs' Motion for Summ. Judg. as to Count II," Cover Sheet and 2nd page (unnumbered), pp. 3-56, cited Jan. 9, 2008.

U.S. District Court in the District of Massachusetts, *Analog Devices Inc.* v. *Silicon Laboratories, Inc.*, Civil Action No. 06-12240(WGY),"Analog Devices' Opposition to Silicon Labs' Motion as to Count II", Cover Sheet and Table of Contents (unnumbered), pp. ii-iii, Introduction (unnumbered), pp. 2-23, cited Jan. 9, 2008.

U.S. District Court in the District of Massachusetts, *Analog Devices Inc.* v. *Silicon Laboratories, Inc.*, Civil Action No. 06-12240(WGY), "Declaration of Baoxing Chen, Ph.D.," signed Aug. 6, 2007, pp. 1-5.

U.S. District Court in the District of Massachusetts, *Analog Devices Inc.* v. *Silicon Laboratories, Inc.* Civil Action No. 06-I2240(WGY),"Declaration of Baoxing Chen, Ph.D.", signed Jan. 9, 2008, pp. 1-3.

European Patent Office, Communication pursuant to Article 96(2) EPC, Application No. 01909157.8-1237, Analog Devices, Inc., Feb. 9, 2006, Cover Sheet (unnumbered), pp. 1-3.

U.S. District Court in the District of Masschusetts, *Analog Devices Inc.* v. *Silicon Laboratories, Inc.*, Civil Action No. 06-12240(WGY),"Declaration of John W. Pint in Support of Analog Devices' Opposition to Silicon Labs' Motion as to Count II", Cover Sheet (unnumbered), pp. 2-3, cited Jan. 9, 2008.

U.S. District Court District of Massachusetts *Analog Devices Inc.* vs. *Silicon Laboratories Inc.*, Civil Action No. 06-12240(WGY), Leave to File Granted on Jan. 17, 2008,"Silicon Labs' Summary Judgment Reply Brief", Cover Sheet (unnumbered), pp. i-ii, pp. 1-13.

E-mail dated Jan. 25, 2008 regarding Notice of Electronic Filing Notice, ECFnotice@mad.uscourts.gov, pp. 1-2.

U.S. District Court District of Massachusetts, *Analog Devices Inc.* vs. *Silicon Laboratories, Inc.* Civil Action No. 06-12240(WGY), "Silicon Labs' Motion for Partial Summary Judgment of Invalidity With Respect to Count V", pp. 1-4, cited Jan. 4, 2008.

U.S. District Court District of Massachusetts, *Analog Devices, Inc.* vs. *Silicon Laboratories Inc.* Civil Action No. 06-12240(WGY),"Silicon Labs' Memorandum of Law in Support of Its Motion for Partial Summ. Judg. as to Count V", Cover Sheet and Table of Contents (unnumbered), p. ii, Introduction (unnumbered), pp. 2-14, cited Jan. 4, 2008.

U.S. District Court District of Massachusetts, *Analog Devices, Inc.* vs. *Silicon Laboratories, Inc.*, Civil Action No. 06-12240(WGY), "Silicon Labs' Rule 56.1 Statement of Undisputed Material Facts in Support of Its Motion for Partial Summ. Judg. as to Count V", Cover Sheet (unnumbered), pp. i-ii, pp. 1-28, cited Jan. 4, 2008.

U.S. District Court In the District of Massachusetts, *Analog Devices, Inc.* v. *Silicon Laboratories, Inc.*, Civil Action No. 06-12240(WGY), "Declaration of Gentry C. McLean in Support of Defendants Motion for Partial Summ. Judg. of Invalidity Regarding Count V", Cover Sheet (unnumbered), pp. 2-4, cited Oct. 26, 2007.

U.S. District Court in The District of Massachusetts, *Analog Devices Inc.* v. *Silicon Laboratories, Inc.*, Civil Action No. 06-12240(WGY) "Plaintiff Analog Devices, Inc.'s Supplemental Disclosure of Asserted Claims and Infringement Contentions", Cover Sheet (unnumbered), pp. 2-4, date unknown, and Attachment 1, Cover Sheet (unnumbered), pp. 1-53.

In the U.S. District Court For The District of Massachusetts, *Analog Devices, Inc.* v. *Silicon Laboratories, Inc.* Civil Action No. 06-12240(WGY), "Plaintiff Analog Devices Inc.'s Responses and Objections to Defendants Third Set of Interrogatories", Cover Sheet (unnumbered), p. 2-3, date unknown, 19-27, and 32.

"Office Action Summary", mailed Aug. 10, 2006, U.S. Appl. No. 10/214,883 (published Mar. 6, 2003), SIL-00003343-00003351.

"Claims", U.S. Appl. No. 10/214,883, published Mar. 6, 2003, SIL-00003848-00003854.

In the United States Patent and Trademark Office,"Amendment, Interview Summary and Request for Reconsideration," U.S. Appl. No. 09/838,520 (published Sep. 26, 2002), dated Sep. 12, 2003, AD1000589-AD1000598, Cover Sheet (unnumbered), pp. 2-10.

"Chip-Scale Coils and Isolators Based Thereon", U.S. Appl. No. 10/214,883, published Mar. 6, 2003, SIL-00003829-00003847, pp. 1-19.

U.S. Patent and Trademark Office cover sheet, U.S. Appl. No. 10/214,883 (Published Mar. 6, 2003),mailed May 29, 2007, "Notice of Abandonment", 2 pages (unnumbered).

"Standard Handbook for Electrical Engineers"Tenth Edition, Copyright 1968, by McGraw-Hill, Inc., 2 Cover Sheets (unnumbered), pp. 15-75, 15-84, and 15-85.

"Electronics Engineers' Handbook", Donald Christiansen, Editor in Chief, Fourth Edition McGraw-Hill, Inc., 1996, 3 pages (unnumbered).

U.S. District Court for The District of Massachusetts, *Analog Devices, Inc.* v. *Silicon Laboratores, Inc.*, Civil Action No. 06-12240-WGY, "Markman Hearing", pp. 1-44, cited Nov. 14, 2007.

U.S. District Court in The District of Massachusetts, *Analog Devices, Inc.* v. *Silicon Laboratories, Inc.*, Civil Action No. 06-12240(WGY) "Declaration of Dr. Dean P. Neikirk in Support of Defendants Motion for Partial Summary Judgment of Invalidity With Respect to Count V," Cover Sheet (unnumbered), pp. 2-3, singed Nov. 14, 2008.

U.S. District Court in the District of Massachusetts *Analog Devices Inc.* v. *Silicon Laboratories, Inc.*, Civil Action No. 06-12240(WGY), "Analog Devices' Opp. to Silicon Laboratores' Motion for Partial Summ. Judg. of Invalidity Re: Count V," Cover Sheet (unnumbered), Table of Contents (unnumbered), pp. ii, Introduction (unnumbered), pp. 2-20, cited Jan. 18, 2008.

U.S. District Court in the District of Massachusetts, *Analog Devices Inc.* v. *Silicon Laboratories Inc.*, Civil Action No. 06-12240(WGY), "Analog Devices, Inc.'s Counter-Statement of Facts Pursuant to Local Rule 56.1 in Support of Its Opposition to Silicon Labs' Motion for Partial Summ. Judg. of Invalidity . . . ", Cover Sheet (unnumbered), pp. 2-72, cited Jan. 9, 2008.

In the U.S. Patent and Trademark Office,"Amendment, Interview Summary and Request for Reconsideration . . . ", U.S. Appl. No. 09/838,520 (published Sep. 26, 2002), Cover Sheet (unnumbered), Sep. 10, 2003, pp. 2-10.

U.S. District Court in the District of Massachusetts *Analog Devices, Inc.* v. *Silicon Laboratories Inc.* "Declaration of Jeremy P. Oczek in Support of Analog Devices' Opposition to Silicon Labs' Motion for Partial Summ. Judg. for Invalidity Re: Count V", Cover Sheet (unnumbered), p. 2, cited Aug. 6, 2007.

U.S. District Court District of Massachusetts, *Analog Devices, Inc.* vs. *Silicon Laboratories, Inc.* Civil Action No. 06-12240 (WGY), Leave to File Granted on Oct. 4, 2007, "Silicon Labs' Claim Construction Sur-Reply Brief", pp. 1-15.

U.S. District Court in the District of Massachusetts *Analog Devices Inc.* vs. *Silicon Laboratories, Inc.*, Civil Action No. 06-12240(WGY)"Oral and Videotaped Deposition of Dr. .Luke J. Turgeon, P.E. Jan. 9, 2008," pp. 1, 48-51, pp. 53-58 pp. 61-64, pp. 79-83, pp. 88-92, pp. 98-102, pp. 103-105, pp. 114-116, pp. 118-120, pp. 199-200, pp. 232-234, pp. 240-246, pgs.

Utility Patent Application Transmittal for U.S. Appl. No. 10/214,883 (published Mar. 6, 2003), filed Aug. 8, 2002, SIL-00003 826-0003864.

U.S. District Court in the District of Massachusetts, *Analog Devices Inc.* v. *Silicon Laboratories, Inc.*, Civil Action No. 06-12240(WGY), "Declaration of Travis N. Blalock, Ph.D.", date unknown pp. 1-2.

In the U.S. District Court For The District of Massachusetts *Analog Devices Inc.* v. *Silicon Laboratories, Inc.* Civil Action No. 06-12240(WGY), "Rebuttal Expert Report of Travis N. Blalock, Ph.D.", Cover Sheet (unnumbered), date unknown, pp. i-ii, pp. 1-153.

U.S. District Court District of Massachusetts, *Analog Devices, Inc.* vs. *Silicon Laboratories Inc.*, Civil Action No. 06-12240(WGY), Leave to File Granted Jan. 24, 2008, Silicon Labs' Reply Brief in Support of Its Motion for Partial Summary Judgment of Invalidity Re: Count V, Cover Sheet (unnumbered), pp. i-ii, pp. 1-13.

U.S. District Court District of Massachusetts, *Analog Devices, Inc.* vs. *Silicon Laboratories Inc.* Civil Action No. 06-12240(WGY), "Leave to File Granted Jan. 24, 2008, Silicon Labs' Regarding Count V," Cover Sheet (unnumbered), pp. j, pp. 1-6.

U.S. District Court District of Massachusetts *Analog Devices, Inc.* vs. *Silicon Laboratories, Inc.*, Civil Action No. 06-12240(WGY) "Leave to File Granted Jan. 24, 2008, Reply to Analog's Counter Statement of Facts for Count V Motion", Cover Sheet (unnumbered), pp. i, pp. 1-12.

Claims Chart "U.S. Patent Nos. 6,262,600, issued Jul. 17, 2001, 6,525,566, issued Feb. 25, 2003, 6,903,578, issued Jun. 7, 2005 and 6,873,065, issued Mar. 29, 2005 in view of U.S. Patent No. 4,785,345 issued Nov. 15, 1988 to Rawls et al.," Exhibit 18 to 1217/07 Neikirk Report, pp. 1-18.

U.S. District: Court District of Massachusetts, *Analog Devices, Inc.* vs. *Silicon Labs Inc.* "Expert Report of Dr. Dean P. Neikirk, Jan. 14, 2008. Regarding Invalidity of Analog Devices Patents," Cover Sheet (unnumbered), pp. 57-68, last sheet (unnumbered).

U.S. District Court District of Massachusetts, *Analog Devices, Inc.* vs. *Silicon Labs, Inc.*, "Expert Report of Dr. Dean P. Neikirk Regarding Non-Infringement of Analog Devices Patents," Cover Sheet (unnumbered), date unknown, pp. 49 and 90.

U.S. District Court In The District of Massachusetts, *Analog Devices Inc.* vs. *Silicon Laboratories Inc.*, Civil Action No. 06-12240(WGY), "Oral and Videotaped Deposition of Dr. Luke J. Turgeon, P.E. Jan. 9, 2008,"p. 1, pp. 13-18, p. 209, pp. 60-61, pp. 67-69, p. 276.

U.S. District Court For The District of Massachusetts, *Analog Devices, Inc.* vs. *Silicon Laboratories Inc.*, "Videotaped Deposition of David A. Hodges Ph.D., Thursday, Jan. 17, 2008", 9:35 A.M., p. 1, pp. 96-109.

U.S. District Court in The Distriet of Massachusetts *Analog Devices, Inc.* v. *Silicon Laboratories, Inc.* Civil Action No. 06-12240 (WGY), "Leave to File Granted Jan. 24, 2008, Declara$^T$I$^O$n of Gentry C. McLean in Support of Silicon Labs' Partial Summary Judgment Reply Brief as to Count V", pp. 1-3.

U.S. District Court in The District of Massachusetts *Analog Devices Inc.* v. *Silicon Laboratories Inc.*, Civil Action No. 06-12240(WGY) "First Supplemental Declaration of Dr. Dean P. Neikirk in Support of Defendant's Motion for Partial Summary Judgment of Invalidity With Respect to Count V", Cover Sheet (unnumbered), date unknown, pp. 2-4.

Email From: ECFnotice@mad.uscourts.gov, sent: Friday, Jan. 25, 2008, To: CourtCopy@mad.uscourts.gov, pp. 1-2 regarding Notice of Electronic Filing.

U.S. District Court District of Massachusetts, *Analog Devices Inc.* vs. *Silicon Labs, Inc.*, "Expert Report of Dr. Dean P. Neikirk Regarding Invalidity of Analog Devices Patents", Cover Sheet (unnumbered), date unknown, pp. i-vii, pp. 1-94, last page (unnumbered).

Dean P. Neikirk, "Biography", Dec. 7, 2007, pp. 1-52.

Materials Considered by Dean Neikirk, date unknown, 4 pages (unnumbered).

Exhibit 10 to Dec. 7, 2007 Neikirk Report, U.S. Patent No. 5,781,077, issued Jul. 14, 1998, to Leitch, pp. 1-18.

Exhibit 12 to Dec. 7, 2007 Neikirk Report, U.S. Patent No. 5,293,400, issued Mar. 8, 1994 to Monod et al., pp. 1-13.

Exhibit 14 to Dec. 7, 2007 Neikirk Expert Report, U.S. Patent No. 5,701,037, issued Dec. 23, 1997 to Weber et al., Cover Sheet (unnumbered); pp. 2-5.

Exhibit 16 to Dec. 17, 2007 Neikirk Report, Japanese Patent No. 57-132460, published Aug. 16, 1982 to Inanari, pp. 1-4.

U.S. District Court in the District of Massachusetts *Analog Devices* v. *Silicon Laboratories, Inc.*, Civil Action No. 06-12240(WGY), "Plaintiff Analog Devices, Inc.'s Supplemental Disclosure of Asserted Claims and Infringement Contentions", cover sheet (unnumbered), date unknown, pp. 2-4, Attachment I (unnumbered), date unknown, pp. 1-53.

Exhibit 20 to Dec. 7, 2007 Neikirk Report, U.S. Patent No. 6,262,600, issued Jul. 17, 2001 to Haigh et al., pp. 1-11.

U.S. District Court for the District of Massachusetts, *Analog Devices, Inc.* v. *Silicon Laboratories, Inc.*, Civil Action No. 06-12240(WGY), "Markman Hearing", cited Nov. 14, 2007, pp. 1-12.

Burr-Brown "A System Designer's Guide to Isolation Devices", Sensors, 1999, pp. SIL-00004907-SIL-00004913.

U.S. District Court for the District of Massachusetts, *Analog Devices Inc.* vs. *Silicon Laboratories, Inc.* Civil Action No. 06-12240(WGY), "Videotaped Deposition of Geoffrey T. Haigh", Exhibits 105-139, vol. 1, date unknown, pp. 1-238.

Exhibit 6 to Dec. 7, 2007 Neikirk Report, French Patent No. 2678670A to Serbanescu, pp. 1-14.

Exhibit 8 to Dec. 7, 2007 Neikirk Report, U.S. Patent No. 5,650,357, issued Jun. 17, 1997 to Dobkin [Ex. 9], pp. 1-24.

Introduction Section 1, Walt Kester, "Origins of Real-World Signals and Their Units of Measurement", date unknown, pp. 1.1-1.9.

Irvine, M.M. "Early Digital Computers at Bell Telephone Laboratories", IEEE Annals of the History of Computing, 2001, date unknown, pp. 22-42.

Laughton et al., Electrical Engineer's Reference Book, Sixteenth Edition, Chapter 14, Newnes, 2003, pp. 3 cover sheets (unnumbered), pp. 14/6-14/9.

IEEE Standard for a High Performance Serial Bus, IEEE Std 1394-1995, 1996, pp. SIL-00006001-SIL-00006392.

U.S. District Court for the District of Massachusetts *Analog Devices Inc.* v. *Silicon Laboratories, Inc.*, Civil Action No. 06-12240(WGY), "Joint Claim Construction Statement", cited Aug. 10, 2007, pp. 1-3.

*Analog Devices, Inc.* v. *Silicon Laboratories, Inc.*, Civil Action No. 06-12240-WGY, "Parties' Disputed Claim Construction", pp. 1-2, Exhibit B, "Parties' Agreed Upon Claim Construction", cited Aug. 10, 2007, pp. 1-2.

Charles H. Roth, Jr., Fundamentals of Logic Design, Third Edition, 1985, 2 pages (unnumbered), pp. 254-256.

Exhibit 70 to Dec. 7, 2007 Neikirk Report, ADI Isolation Amplifier AD203SN, pp. 1-4.

Streetman, Ben G. Solid State Electronic Devices, Second Edition, Prentice-Hall Series in Solid State Physical Electronics, 1980, 2 Cover Sheets (unnumbered), pp. 346-347.

Charles H. Roth, Jr., Fundamentals of Logic Design, "Discrete and Integrated Circuit Logic Gates", Third Edition, 1985, 2 Cover Sheets (unnumbered), pp. 613-616.

Dual Digital Isolators, Texas Instruments, 2006-2007 Cover Sheet (unnumbered) pp. 2-19, Addendum, pp. 1-2, Pack Materials, pp. 1-2, Plastic Small-Outline Package, 2 pages (unnumbered).

3.3V5-V High-Speed Digital Isolators, Texas Instruments, 2006-2007, pp. 1-18, Addendum, pp. 1-2, Pack Materials, pp. 1-2, Plastic Small-Outline Package, 2 pages (unnumbered).

Quad Digital Isolators, Texas Instruments, 2007, cover sheet (unnumbered), pp. 2-19, Addendum, pp. 1-2, Pack Materials, pp. 1-2, Plastic Small-Outline Package, 2 pages (unnumbered).

QCPL-073H, Dual-channel High Speed 15 MBd CMOS optocoupler Datasheet, Avago Technologies, date unknown, 10 pages (unnumbered).

QCPL-070H, Single-channel High Speed 15 MBd CMOS otocoupler Datasheet, Avago Technologies, date unknown, 10 pages (unnumbered).

Chen et al., High Speed Digital Isolators Using Microscale On-Chip Transformers, Exhibit 314, Oct. 31, 2007, pp. AD1002178-AD1002183.

Audio Tranformers: 2 Ohm to 40K Ohm; 400 Hz to 100 KHz; 400 miliwatt at 1 KHz, PICO Electronics, date unknown, 8 pages (unnumbered).

RF Transformers, Transformers for Wideband RF Applications, Pulse, A Technitrol Company, date unknown, 2 pages (unnumbered).

Business Wire: Pulse's New Miniature Transformers are Optimized for Wideband RF Applications, Jul. 26, 2000, pp. 1-2.
Park et al., "Packaging Compatible Microtransformers on a Silicon Substrate", IEEE Transactions on Advanced Packaging, vol. 26, No. 2, May 2003, pp. 160-164.
XFA-0401-1U, Surface Mount Transformer, Premier Devices, Inc., date unknown, I page (unnumbered).
IL710, High Speed Digital Coupler, Rev. E, NVE Corporation, date unknown, pp. SIL-00005879-SIL00005886.
IL260/IL261, High Speed Five-Channel Digital Isolators, NVE Corporation, Cover Sheet (unnumbered), date unknown, pp. 2-11.
Hermann et al., "Magnetically Coupled Linear Isolator", IEEE Transactions on Magnetics, vol. 33, No. 5, Sep. 1997, pp. 4029-4031.
Nihtianov, Stoyan "Magnetogalvanic Approach to Isolation of Analog Circuits", IEEE Transactions on Instrumentation and Measurement, vol. 43, No. 4, Aug. 1994, pp. 677-680.
Silicon Laboratories, [Si8440/41/42/45, "Quad-Channel Digital Isolator", Rev.0.6, Aug. 2007, cover sheet (unnumbered), pp. 2-30.
Silicon Laboratories, Si8430/31/35, "Triple-Channel Digital Isolator", Rev. 0.3, Aug. 2007, cover sheet (unnumbered), pp. 2-30.
Email from Park, Ted, Sent Wednesday, Aug. 9, 2006, To ODoherty, Pat, Subject RE: Samsung SDI iCoupler Business Update, date unknown, pp. ADI28361-ADI128367.
U.S. District Court in The District of Massachusetts *Analog Devices, Inc.* v. *Silicon Laboratories Inc.*, Civil Action No. 06-12240(WGY),"Plaintiff Analog Devices Inc.'s Supplemental Disclosure of Asserted Claims and Infringement Contentions", Cover Sheet (unnumbered), date unknown, pp. 2-4, and Attachment 1, cover sheet (unnumbered), pp. 1-53.
Silicon Laboratories, Inc., Bonding Diagram Specification ASY-32044, date unknown, pp. 1-3.
Email from Tim J. Dupuis, Sent Tuesday, Apr. 4, 2006, To Bruce Webb; Walt S. Schopfer, Subject Isolator Design Reviews, date unknown, pp. SIL-0018097-SIL-0018261.
U.S. District Court in The District of Massachusetts *Analog Devices Inc.* vs. *Silicon Laboratories, Inc.*, Civil Action No. 06-I2240(WGY), "Oral and Videotaped Deposition of Timothy J. Dupuis, Oct. 24, 2007", p. 1, pp. 72-75, pp. 126-127, pp. 169-172, p. 204.
2 datasheets, User: dholberg, Date: Wed May 9 14:07:42 2007, Plot Size: 5.09x 10.50 inches, Magnification: 174.36X, Library: Isolator, Cell: si8440, View: layout, Plot Area: (0.0.0.0) (741.31 1 529.61), 2 pages (unnumbered).
U.S. District Court for The District of Massachusetts, *Analog Devices, Inc.* vs. *Silicon Laboratories Inc.*, "Videotaped 30(b) (6) Deposition of Analog Devices by Ronn Kliger and of Roan Kliger Individually," Wednesday, Oct. 31, 2007, 9:51 a.m., p. 1, p. 20, pp. 43-51, p. 234.
Silicon Laboratories, Various schematic diagrams, date unknown, pp. SIL-0320244-SIL-0320262.
Texas Instruments, Technology for Inventors, "Interface", http://focus.ti.com, date unknown, I page (unnumbered).
Avago Technologies, Cross Reference Search Results, http://avago.mnl.com, date unknown, 1 page (unnumbered).
"Supplemental Amendment" In re Patent Appl. of: Geoffrey T. Haigh, et al., U.S. Appl. No. 09/872,779 (published Feb. 14, 2002), Title: Isolator for Transmitting Logic Signals Across an Isolation Barrier, pp. 1-3, Fax Cover Sheet Hale and Dorr Llp, p. 1 cited Aug. 19, 2002.
Exhibit 104 to Jan. 4, 2008 Neikirk Report, WO 99/21332 to Haigh [Ex. 42] et al., pp. 1-7.
S. Wolf, Silicon Processing for the VLSI Era, vol. 2—Process Integration, Latice Press, 1990, 2 Cover Sheets (unnumbered), pp. 66-69.
U.S. Appl. No. 60/466,602, filed Apr. 30, 2003, "Bi-directional Signal Isolators Using Micro-transformers", including U.S. Patent and Trademark Office Bib Data Sheet, and Drawings, date unknown, pp. AD1001934-ADI001942.
The Poetical Works of Longfellow, 2 Cover Sheets (unnumbered), pp. 207-209.
Various Diagrams (Bond Wires)(Magnetic field), dare unknown, 7 pages (unnumbered).
Chiu et al., "Thin-Film Inductive Heads", IBM, J. Res. Develop., vol. 40 No. 3, May 1996, pp. 283-300.

TSang et al., Design, fabrication and performance of spin-valve read heads for magnetic recording applications, IBM J. Res. Develop, vol. 42, No. 1, Jan. 1998, pp. 103-116.
Exhibit 117 to Jan. 4, 2008 Neikirk Report, U.S. Patent No. 4,024,452 issued May 17, 1977 to Seidel [Ex. 117], pp. 1-10.
Tarlton Fleming, Ed., "Isolation amplifiers break ground loops and achieve high CMRR", EDN, Dec. 1987, pp. 97-102, and p. 5.
U.S. District Court for The District of Massachusetts, *Analog Devices, Inc.* v. *Silicon Laboratories, Inc.*, Civil Action No. 06-12240(WGY), "Analog Devices, Inc.'s Claim Construction Reply Brief,"cited Sep. 28, 2007, Cover Sheet (unnumbered), pp. 13-14.
Materials Considered by Dean Neikirk, date unknown, 7 pages (unnumbered).
Biography Dr. Luke J. Turgeon, PE, date unknown, 4 pages (unnumbered).
IEEE 100, The Authoritative Dictionary of IEEE Standards Terms, Seventh Edition, date unknown, 3 pages (unnumbered).
The Electromagnetic Spectrum Chart by LASP/University of Colorado, Boulder, date unknown 1 page (unnumbered).
U.S. District Court for the District of Massachusetts *Analog Devices, Inc.* v. *Silicon Laboratories, Inc.*, Civil Action No. 06-12240-WGY, "Markman Hearing", Nov. 14, 2007, pp. 1-44.
Exhibit 10 to Dec. 7, 2007 Turgeon Report, U.S. Patent No. 4,785,345 issued Nov. 15, 1988 to Rawls et al., pp. 1-7.
Streetman, Ben G., Solid State Electronic Devices, Third Edition, Prentice Hall, Chapter 1, "Crystal Properties and Growth of Semiconductors", date unknown, pp. SIL-0320240-SIL-0320243 and p. 355.
S.M. Sze, Physics of Semiconductor Devices, Second Edition, John Wiley & Sons, 1981, 2 Cover Sheets (unnumbered, and p. 1.
In the U.S. District Court for The District of Massachusetts, *Analog Devices, Inc.* v. *Silicon Laboratories, Inc.*, Civil Action No. 06-12240(WGY), "Rebuttal Expert Report of Travis N. Blalock, Ph.D.", Cover Sheet (unnumbered), date unknown, pp. i-ii, pp. 1-153.
Exhibit 1, Travis N. Blalock Biography, date unknown, Cover Sheet and 5 pages (unnumbered).
Exhibit 2, Listing of Publications and Patents date unknown, Cover Sheet (unnumbered), pp. 1-5.
Exhibit 3, Wedlock et al., "Electronic Components and Measurements", Prentice-Hall, Inc., 1969, 5 Sheets (unnumbered), and p. 89.
Exhibit 4, the documents bearing Bates Nos. AD1132891-892 ADI132876, ADI132881-882, AD1132885-886, and AD1132860-861.email messages, date unknown, Cover Sheet (unnumbered), and pp. 1-3.
Exhibit 5, the documents bearing Bates Nos. SIL-0144437, SIL-0237769 and SIL-0173171,e-mail messages, date unknown, Cover Sheet (unnumbered), and pp. 1-2.
Exhibit 6, miscellaneous publications including "Isolation in Medical Applications", "Isolation Technologies for Reliable Industrial Measurements", "Medical devices demand stringent isolation techniques", "Electronics Technology Elite Compete for Industry's Highest Honors as EE Times Announces Finalists for 2007 EE Times ACE Awards", 41 pages (unnumbered).
Exhibit 7, IEEE 100 The Authoritative Dictionary of IEEE Standard Terms, Seventh Edition, Standards Information Network, IEEE Press, 2000, 3 pages (unnumbered), and pp. 168, 351, 592, 911, and 1123.
Exhibit 8, Japanese Patent Application No, S56-18236 published Aug. 16, 1982, entitled "Insulation Method", translation to English, 9 pages (unnumbered).
McGraw-Hill Dictionary of Scientific and Technical Terms, Fifth Edition, 1994, 3 pages (unnumbered), and pp. 1797-1798.
Claims Chart, U.S. Patent No. 6,873,065, issued Sep. 26, 202, in view of U.S. Patent No. 5,369,666, issued Nov. 29, 1994, "Modem with Digital Isolation," to Folwell, et al., pp. 1-2.
Claims Chart, U.S. Patent No. 7,075,329, issued Mar. 17, 2005, in view of U.S. Patent No. 6,262,600, issued Jul. 17, 2001 to Haigh et al., 6 pages (unnumbered).
Hewlett Packard, HCPL-0710, "40 ns Prop. Delay, SO-8 Optocoupler", Technical Data, date unknown, 16 pages (unnumbered).

Claims Chart, U.S. Patent No. 6,262,600, issued Jul. 17, 2001, in view of U.S. Patent No. 5,469,098 issued Nov. 21, 1995 to Johnson, Jr., 12 pages (unnumbered).
Claims Chart, U.S. Patent No. 6,262,600 issued Jul. 17, 2001 in view of AD260/AD261 as described in "Practical Design Techniques for Sensor Signal Conditioning," Kester, W. ed., 11 pages (unnumbered).
Claims Chart, U.S. Patent No. 6,262,600 issued Jul. 17, 2001 in view of U.S. Patent No. 6,728,320, issued Apr. 27, 2004, Capacitive Data and Clock Transmission Between Isolated ICs, to Khasnis et al., pp. 1-7, 4 pages (unnumbered).
Claims Chart, U.S. Patent No. 6,262,600 issued Jul. 17, 2001 in view of "A Monolithic Signal Isolator," by Knoedl et al., pp. 1-13.
Claims Chart, U.S. Patent No. 6,262,600 issued Jul. 17, 2001 in view of "Electrical Isolation of Endoscopic Video Camera," U.S. Patent No. 5,716,323, issued, Feb. 10, 1998, to Lee, 3 pages (unnumbered).
Claims Chart U.S. Patent No. 6,262,600 issued Jul. 17, 2001, in view of U.S. Patent No. 5,781,077, issued Jul. 14, 1998 to Leitch, 12 pages (unnumbered).
Claims Chart, Patent No. 6,262 600 issued Jul. 17, 2001, in view of "Method of Controlling Communication in an ID System,", U.S. Patent No. 4,924,210, issued May 8, 1990 to Matsui et al., pp. 1-3.
Claims Chart, U.S. Patent No. 7,075,329, issued Jul. 11, 2006 in view of Transformer Isolated Driver and Isolated Forward Converter, U.S. Patent No. 6,069,802, issued May 30, 2000 to Priegnitz, pp. 1-3.
Claims Chart, U.S. Patent No. 6,262,600 issued Jul. 17, 2001 in view of "Isolated gate driver for power switching device and method for carrying out same," U.S. Patent No. 5,900,683, issued May 4, 1999 to Rinehart, pp. 1-4.
Claims Chart U.S. Patent No. Issued 0/17/2001, in view of French Patent No. 2678670A to Serbaneseu, 9 pages (unnumbered).
Claims Chart, U.S. Patent No. 6,262,600, issued Jul. 17, 2001, in view of "An Isolated MOSFET Gate Driver", by Geoff Walker, pp. 1-7.
Claims Chart, U.S. Patent No. 6,262,600, issued Jul. 17, 2001, in view of ADI Isolation Amplifier Data Sheets including AD202, AD203SN, AD210, 12 pages (unnumbered).
Claims Chart, U.S. Patent No. 7,075,329, issued Jul. 11, 2006 in view of ADuMIIOOAR/ADuMIIOOBR, 3 pages (unnumbered).
Claims Chart, U.S. Patent No. 6,873,065,issued Mar. 29, 2005 in view of Bougeois, J.M. "PCB Based Transformer for Power MOSFET Drive", pp. 1-2.
Claim Chart, U.S. Patent No. 7,075,329 issued Jul. 11, 2006 in view of Kilger, R. et al. "Micromachined magnetics: a new step in the evolution of isolation technology," Electronic Engineering, Jun. 2000, pp. 27-32, 4 pages (unnumbered).
In The U.S. District Court for The District of Massachusetts, *Analog Devices Inc.* v. *Silicon Laboratories, Inc.*, case No. I :06-CV-12240(WGY),"Jury Trial Demand, Silicon Labs Preliminary Invalidity Contentions," date unknown, Cover Sheet (unnumbered), pp. 2-21.
In the U.S. District Court for The District of Massachusetts, *Analog Devices, Inc.* v. *Silicon Laboratories, Inc.*, Case No. 1:06-CV-12240 WGY,"Jury Trial Demand, Silicon Labs First Supplemental Invalidity Contentions," date unknown, including supporting documents Cover Sheet (unnumbered), pp. 2-22, and supporting documents including 102 pages (unnumbered).
In the U.S. District Court for The District of Massachusetts, *Analog Devices, Inc.* vs. *Silicon Laboratories, Inc.*, Case No. 1:06-CV-12240 WGY,"Jury Trial Demand, Silicon Labs Second Supplemental Invalidity Contentions", date unknown, Cover Sheet (unnumbered), pp. 2-25.
Claims Chart, U.S. Patent Nos. 6,626,600, issued Jul. 17, 2001, 6,525 566, issued Feb. 14, 2002, 6,903,578, issued Jun. 7, 2005, and 7,075,329, issued Jun. 11, 2006 in view of U.S. Patent No. 5,293,400, issued Mar. 8, 1994 to Monod et al., 9 pages (unnumbered).
In The U.S. District Court for The District of Massachusetts, *Analog Devices Inc.* v. *Silicon Laboratories, Inc.* Case No. 1:06-CV-122400(WGY), "Jury Trial Demand, Silicon Labs Third Supplemental Invalidity Contentions", date unknown, Cover Sheet (unnumbered), pp. 2-28.
U.S. District Court for The District of Massachusetts, *Analog Devices Inc.* v. *Silicon Laboratories Inc.*, Civil Action No. 06-12240(WGY)

Joint Claim Construction Statement, Cover Sheet (unnumbered), pp. 2-3, including Exhibits A & B, cited Aug. 10, 2007, 5 pages (unnumbered).
In The U.S. District Court for The District of Massachusetts, *Analog Devices, Inc.* v. *Silicon Laboratories, Inc.*, Civil Action No. 06-12240(WGY), Oral Argument Requested, "Analog Devices, In.'s Opening Claim Construction Brief", cited Aug. 31, 2007, pp. 1-26.
Exhibit A, "Summary of the Claim Construction Issues, The '600, '566, and '578 Patents", pp. 1-3.
Exhibit B, "List of Representative Asserted Claims for the Patents-in-Brief", date unknown, pp. 1-4.
Exhibit H, "The American Heritage Dictionary of the English Language", American Heritage Publishing Co., 1999, 3 Cover Sheets (unnumbered), p. 516.
Exhibit I, "Encarta World English Dictionary", St. Martin's Press, 1999, 3 Cover Sheets (unnumbered), p. 699.
Exhibit J, The Concise Oxford Dictionary, Oxford University Press, 1999, 3 Cover Sheets (unnumbered), p. 556.
Exhibit K, Part I, Silicon Laboratories, Data Sheet for Si306x, Rev. 0.9,"Global Line-Side DAA For Embedded System-Side Module," Jan. 2005, Cover Sheet and pp. 1-30.
Exhibit K, Part 2, Silicon Laboratories, Si306x, Rev. 0.9, date unknown, Cover Sheet and pp. 31-62.
Rudolf F. Graf, Modem Dictionary of Electronics, Seventh Edition, Newnes, 1999, 7 pages (unnumbered).
Presentation on claims of '600 Patent, '566 Patent, '578 Patent, '065 Patent, pp. 1-6.
European Patent Office "Decision to refuse a European Patent application", Application No. 01 909 157.8-1237, 13 pages, dated Mar. 15, 2007 (unnumbered).
Analog Devices, "Frequently Asked Questions", Isolation, iCoupler Technology, and iCoupler Products Mar. 2006, pp. AD1002323-ADI002332.
'600 Patent Family, 1 page (unnumbered).
Analog Devices, "iCoupler Digital Isolation Products", date unknown, pp. AD1002006-AD1002017.
Digital Isolation, Power Electronics Europe, "Isolation with Waferscale Transformers", Issue 6, 2005, pp. 40-43.
U.S. District Court, Tyler Division, *Analog Devices, Inc.* v. *Silicon Laboratories Inc.*, Civil Action No. 06-12240 (WGY), "Declaration of Nicholas A. Schuneman in Support of Silicon Labs' Claim Construction Brief", cited Sep. 14, 2007, Cover Sheet (unnumbered, pp. 2-4.
Philip Babcock Gove, Ph.D., Editor in Chief, Webster's Third New International Dictionary of the English Language Unabridged, Konemann Verlagsgesellschaft MBH, 1993, 3 pages (unnumbered), and p. 1680.
European Patent Office, Provision of the minutes in accordance with Rule 76(4) EPC, Patent Application No. 01 909 157.8-1237, mailed Mar. 15, 2007, 9 pages (unnumbered).
In The U.S. District Court for The District of Massachusetts No. 1:06-CV-12240(WGY), *Analog Devices, Inc.* vs. *Silicon Laboratories Inc.*,"Videotaped Deposition of Baoxing Chen, Ph.D.", Wednesday, Sep. 5, 2007 9:43 a.m., Proskauer Rose LLp, pp. 1, 98-101, and 267.
*Analog Devices Inc.* v. *Silicon Laboratories, Inc.*, U.S.D.C. Mass. Civil No. Action No. 06-12240(WGY), "Plaintiff Analog Devices, Inc.'s Preliminary Infringement Contentions May 25, 2007", pp. 1-28.
U.S. District Court, District of Massachusetts, *Analog Devices Inc.* vs. *Silicon Laboratories, Inc.*, Civil Action No. 06-12240(WGY), "Silicon Labs' Claim Construction Brief", cited Sep. 14, 2007, Cover Sheet (unnumbered), pp. i-iii, pp. 1-21.
In The U.S. District Court for The District of Massachusetts, *Analog Devices, Inc.* v. *Silicon Laboratories, Inc.*, Civil Action No. 06-12240 (WGY), "Analog Devices, Inc.'s Claim Construction Rely Brief", cited Sep. 28, 2007, Cover Sheet and Table of Contents (unnumbered), pp. 1-14.
Circuit—Definitions from Dictionary.com, 14 results for: circuit, date unknown, p. 2 of 10, http://dictionary.reference.com/browse/circuit, Sep. 28, 2007.
Highlights of the Si844x Quad Digital Isolators, datasheet, Silicon Laboratories, date unknown, one page, SIL-0007143.

IEEE 100, The Authoritative Dictionary of IEEE Standards Terms, Seventh Edition, IEEE, date unknown, 2 pages (unnumbered), and pp. 168-169.
Silicon Laboratories, News Release "Silicon Laboratories Announces Industry'S Fastest, Most Integrated Four Channel Digital Isolators", date unknown, pp. SIL-0007561-SIL-0007563.
Analog Devices data sheet, AD260, "High Speed, Logic Isolator with Power Transformer", date unknown, pp. SIL-00006531-SIL-00006538.
In the U.S. District Court for The District of Massachusetts, *Analog Devices, Inc.* v. *Silicon Laboratories, Inc.*, Civil Action No. 06-12240(WGY), "Plaintiff Analog Devices, Inc.'s Responses and Objections to Defendant's Third Set of Interrogatories", date unknown, cover sheet (unnumbered), pp. 2-32.
Materials Considered by Luke Turgeon, date unknown, 2 pages (unnumbered).
In the U.S. District Court District of Massachusetts, *Analog Devices, Inc.* vs. *Silicon Laboratories Inc.*, Civil Action No. 06-12240(WGY), "Expert Report of Dr. Luke J. Turgeon, P.E. Regarding Invalidity of U.S. Patent No. 6,873,065," issued Mar. 29, 2005, date unknown, 2 Cover Sheets (unnumbered), p. ii, pp. 3-33.
In the U.S. District Court for The District of Massachusetts, *Analog Devices, Inc.* v. *Silicon Laboratories, Inc.*, Civil Action No. 06-12240 WGY, "Supplemental Rebuttal Expert Report of Travis N. Blalock, Ph.D.", date unknown, Cover Sheet (unnumbered), pp. 1-12.
Analog Devices, Inc. data sheet, AD208, High Precision, Low Offset, mV Input Isolation Amplifier, date unknown, Cover Sheet (unnumbered), pp. 2-16.
Claims chart, U.S. Patent Nos. 6,262,600, issued Jul. 17, 2001, 6,525,566, published Feb. 14, 2002, 6,903,578, published Oct. 21, 2004, 6,873,065, published Sep. 26, 2002 and 7,075,329, published Mar. 17, 2005 in view of U.S. Patent No. 5,650,357, published Jul. 22, 1997 to Dobkin, 13 pages (unnumbered).
Datasheet "Welcome to the 17th Annual EDN Innovation Awards", Reed Business Information, 1997-2007, 2 pages.
One sheet labeled "Power Electronics Europe", Jul. 2005, (unnumbered).
Information sheet, "powerZONE Products for the week of May 26, 2003", pp. 1-2.
Data sheet, National Instruments, NI Developer Zone, "Technologies behind NI Industrial M and S Series Data Acquisition Devices with Isolation", date unknown, pp. 1-5.
Press Release, "Emerson Selects Analog Devices' Digital Isolation Technology for Industrial Systems; ADI's iCoupler Technology Enables Low-Cost Signal Isolation in High-Temperature Environments", Sep. 24, 2003, Business Wire, pp. 1-2.
Press Release, Mentor Graphics, "EE Times Names ACE Finalists", EEtimes Online, Jan. 15, 2007, pp. 1-3.
Press Release, Global Sources, EE TimesAsia, New Products, "ADI digital isolators reduce per-channel costs", Jun. 19, 2003, p. 1 of 1.
Zhou, Jian-jun et al., "A Fully Integrated CMOS 900MHz LNA utilizing Monolithic Transformers".
Zhou, Jianjun J., et al., "Monolithic Transformers and Their Application in a Differential CMOS RF Low-Noise Amplifier", IEEE Journal of Solid State Circuits, vol. 33, No. 12, pp. 2020-2027 (Dec. 1998).
Green, M.W., et al., "Miniature Multilayer Spiral Inductors, for GaAs MMICs", IEEE GaAs 1C Symposium, pp. 303-306 (1989).
Ronkainen, H. et al., "IC Compatible Planar, Inductors on Silicon", IEE Proc.—Circuits Devices Syst., vol. 144, No. 1, (Feb. 1997).
Burr-Brown, "Dual, Isolated, Bi-Directional Digital Coupler", 1993, IS0150.
Burr-Brown, "Dual, Isolated, Bi-Directional Digital Coupler", 2000, IS0150.
Knoedl, G., Jr., et al., "A Monolithic Signal Isolator". IEEE (1989).
Hewlett Packard, 40 ns Prop, Delay, SO-8 Optocoupler: Technical Data for HCPL-0710 (1997).
Walker, G., et al., "An Isolated MOSFET Gate Driver", Dept. of Electrical & computer Engineering, University of—Newcastle, Australia.
Kester W., "Practical Design Techniques for Sensor Signal Conditioning", Analog Devices, Inc., pp. 10.55-10.57 (1999).
Simburger, W., et al., "A Monolithic Transformer Coupled 5-W Silicon Power Amplifier with 59% PAE at 0.9 GHz", IEEE Journal of Solid-State Circuits, vol. 34, No. 12 (Dec. 1999).
Bourgeois, J.M., "PCB Based Transformer for Power MOSFET Drive", IEEE, pp. 238-244 (1994).
Banerjee and Kliger, "Micromachined Magnetics: a New Step in the Evolution of Isolation Technology", Electronic Engineering (Jun. 2000).
Analog Devices, Inc., "High Speed Digital Isolators, ADuM1100AR/ADuM11OOBR", Rev. 0 data sheet (2001).
Sayani et al., "Isolated Feedback For Off-Line Switching Power Supplies with Primary-Side Control", IEEE pp. 203-211 (1998).
Analog Devices, Inc., "Low Cost, Miniature Isolation Amplifiers, AD202/AD204", Rev. B data sheet (1994).
Analog Devices, Inc., Rugged, Military Temperature Range, 10 kHz Bandwidth Isolation Amplifier, AD203SNW, Rev. A data sheet.
Analog Devices, Inc., "High Precision, Low Offset, mV Input Isolation Amplifier, AD208" data sheet.
Analog Devices, Inc., "Precision, Wide Bandwidth 3-Port Isolation Amplifier, AD210" Rev. A data sheet.
Analog Devices, Inc., "High Speed, Logic Isolator With Power Transformer, AD260", Rev. 0 data sheet (1998).
Kester, W., "Origins of Real-World Signals and Their Units of Measurement", section 1, pp. 1.1-1.10.
International Search Report for PCT/US2004/013806, mailed on Jun. 24, 2005.

* cited by examiner

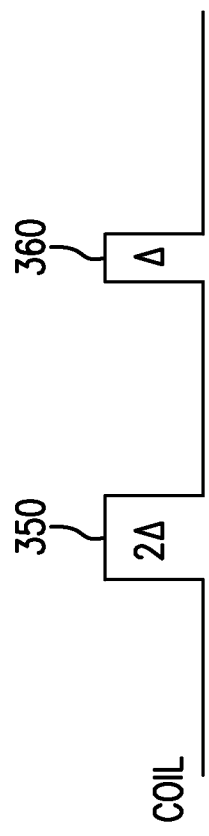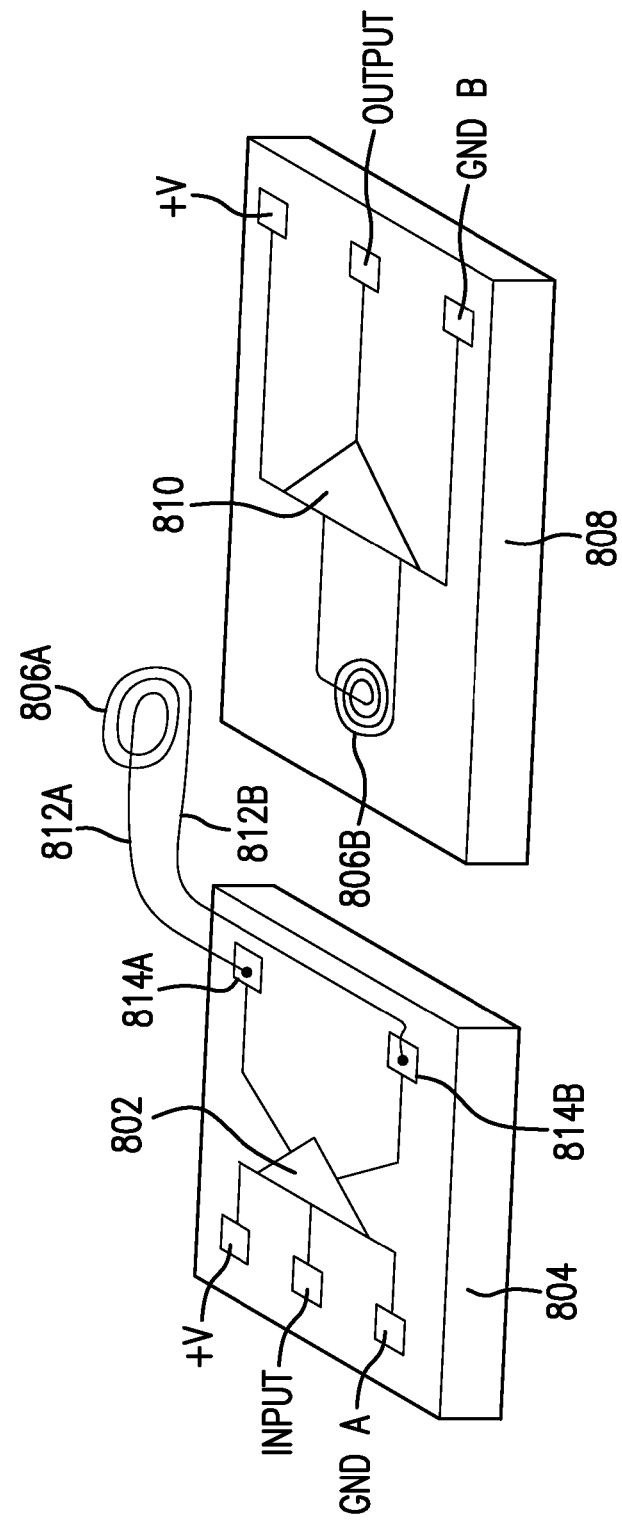

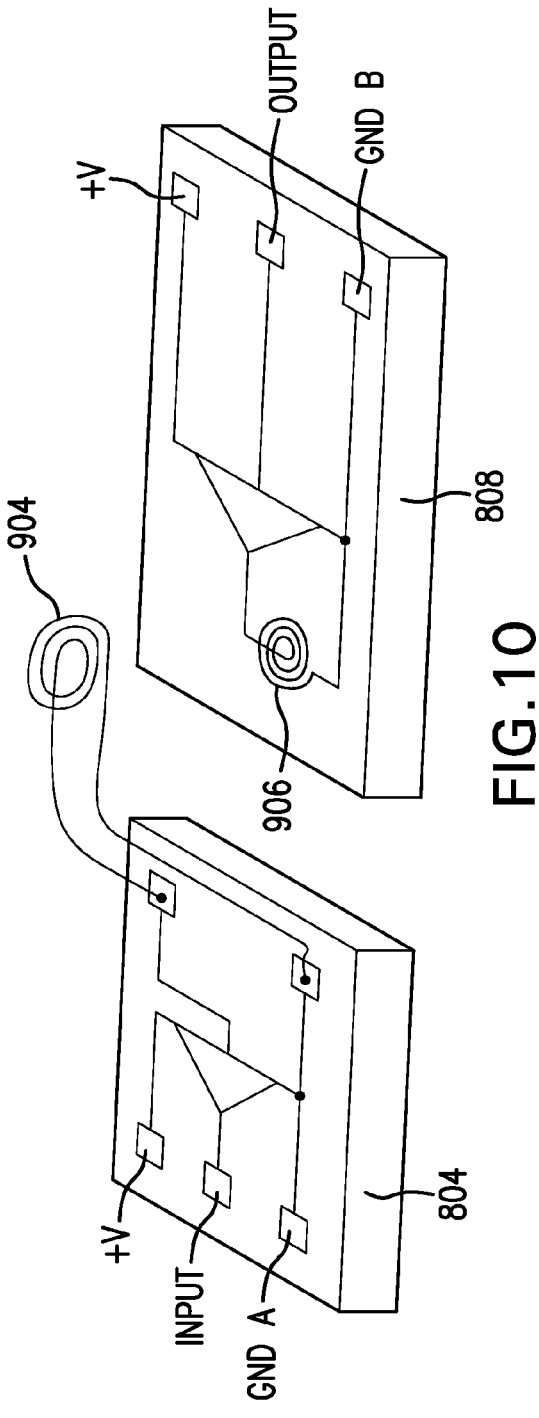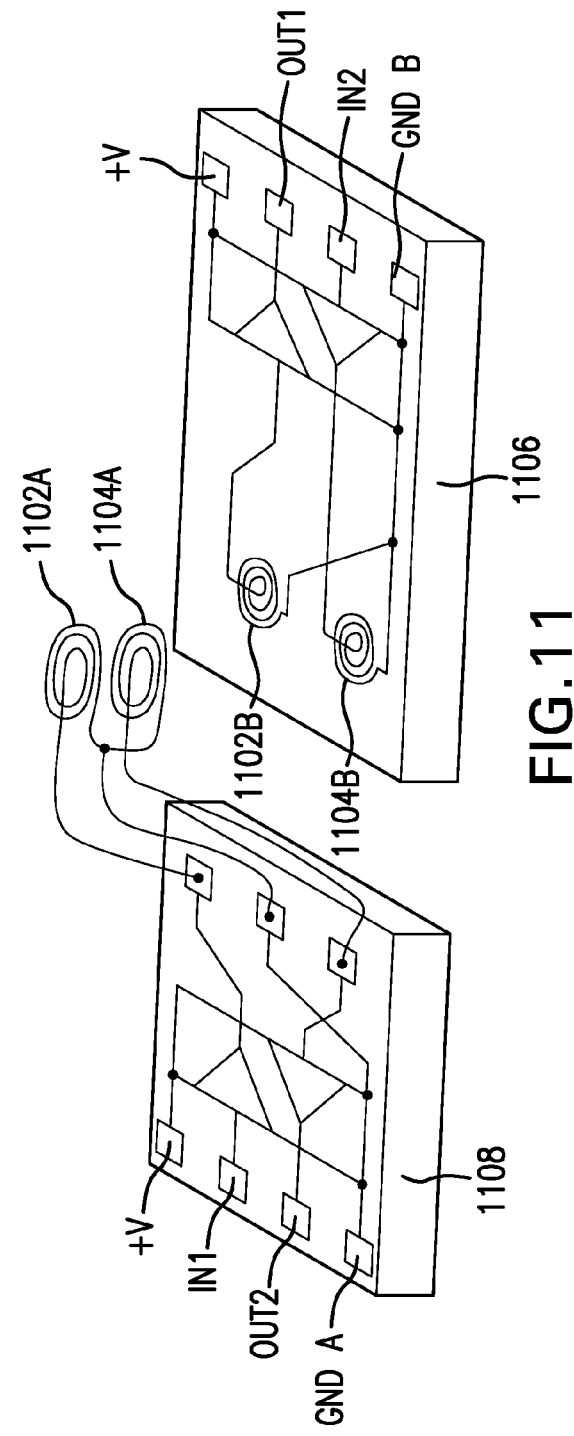

SIGNAL ISOLATORS USING MICRO-TRANSFORMERS

RELATED APPLICATIONS

This application is a Continuation application of U.S. patent application Ser. No. 12/005,675, filed on Dec. 27, 2007 now U.S. Pat. No. 7,683,654, and entitled "SIGNAL ISOLATORS USING MICRO-TRANSFORMERS," which is herein incorporated by reference in its entirety, and which is a Continuation application of U.S. patent application Ser. No. 11/481,997, filed on Jul. 6, 2006 now U.S. Pat. No. 7,692,444, which is a Continuation application of U.S. patent application Ser. No. 10/834,959 filed on Apr. 29,2004, Pat. No. 7,075,329, which claims benefit of and priority to U.S. Provisional Application Ser. No. 60/466,602 entitled "BI-DIRECTIONAL SIGNAL ISOLATORS USING MICRO-TRANSFORMERS," filed on Apr. 30,2003. All of the above applications are hereby incorporated by reference herein.

FIELD OF THE INVENTION

The subject invention relates to signal isolators, more particularly digital signal isolators, and even more particularly to digital signal isolators employing transformers to establish an isolation barrier.

BACKGROUND OF THE INVENTION

In a variety of environments, signals must be transmitted between diverse sources and circuitry using those signals, while maintaining electrical (i.e., galvanic) isolation between the sources and the using circuitry. Isolation may be needed, for example, between microcontrollers, on the one hand, and devices or transducers which use microcontroller output signals, on the other hand. Electrical isolation is intended, inter alia, to prevent extraneous transient signals, including common-mode transients, from inadvertently being processed as status or control information, or to protect the equipment from shock hazards or to permit the equipment on each side of an isolation barrier to be operated at a different supply voltage, among other known objectives and uses.

A variety of isolation techniques are known, including the use of optical isolators that convert input electrical signals to light levels or pulses generated by light emitting diodes, and then to receive and convert the light signals back into electrical signals. Isolators also exist which are based upon the use of Hall effect devices, magneto-resistive sensors, capacitive isolators and coil- or transformer-based isolators.

Optical isolators, which are probably the most prevalent, present certain well-known limitations. Among other limitations, they require significant space on a card or circuit board, they draw a large current, they do not operate well at high frequencies, and they are very inefficient. They also provide somewhat limited levels of isolation. To achieve greater isolation, optical-electronic isolators have been made with some attempts at providing an electrostatic shield between the optical transmitter and the optical receiver. However, a conductive shield which provides a significant degree of isolation is not sufficiently transparent for use in this application.

In the area of non-optical isolation amplifiers for use in digital signaling environments, U.S. Pat. No. 4,748,419 to Somerville, shows the differentiation of an input data signal to create a pair of differential signals that are each transmitted across high-voltage capacitors to create differentiated spike signals for the differential input pair. Circuitry on the other side of the capacitor barrier has a differential amplifier, a pair of converters for comparing the amplified signal against high and low thresholds, and a set/reset flip-flop to restore the spikes created by the capacitors into a logic signal. In such a capacitively-coupled device, however, during a common mode transient event, the capacitors couple high, common-mode energy into the receiving circuit. As the rate of voltage change increases in that common-mode event, the current injected into the receiver increases. This current potentially can damage the receiving circuit and can trigger a faulty detection. Such capacitively coupled circuitry thus couples signals that should be rejected. The patent also mentions, without elaboration, that a transformer with a short R/L time constant can provide an isolation barrier, but such a differential approach is nonetheless undesirable because any mismatch in the non-magnetic (i.e., capacitive) coupling of the windings would cause a common-mode signal to appear as a difference signal. Transformer cost and size may also be a negative factor, and transformers having cores of magnetic materials such as ferrites become inefficient at high frequencies and are not useful for coupling high-speed digital signals.

Commonly-owned U.S. Pat. No. 5,952,849 shows another logic isolator which avoids use of optical coupling. This logic isolator exhibits high transient immunity for isolating digital logic signals.

A need exists, however, for a less expensive, higher performance digital signal isolator with good dynamic characteristics at high frequencies or speeds.

Moreover, needs exist for logic isolators which provide improved low-cost bidirectional signal transmission capabilities and which can be configured for a variety of signal transmission configurations.

A need further exists for improved signaling schemes for use in isolators, to permit a logic isolator to be based on a single micro-transformer.

These needs are addressed with a logic signal isolator comprising, in a first aspect, a transformer having a primary winding and a secondary winding; a transmitter circuit which drives said primary winding in response to a received logic signal, such that in response to a first type of edge in the logic signal, a signal of a first predetermined type is supplied to the primary winding and in response to a second type of edge in the logic signal, a signal of a second predetermined type is supplied to said primary winding, the primary winding and the transmitter being referenced to a first ground; and the secondary winding being referenced to a second ground which is galvanically (i.e., electrically) isolated from the first ground and said secondary winding supplying to a receiver circuit signals received in correspondence to the signals provided to the primary winding, the receiver reconstructing the received logic signal from the received signals. The isolator's receiver may include circuitry for distinguishing between the received signals corresponding to the transmitted signals of the first type and second type and using the distinguished received signals to reconstitute the received logic signal. The signals of the first type may, for example, comprise multiple pulses in a predetermined pattern and the signals of the second type comprise one or more pulses in a different pattern. The signals of the first type also may comprise pulses of a first duration and the signals of the second type may comprise pulses of a second, distinguishable duration. At least one of the signals of the first or the second type also may comprise at least one burst. If both comprise bursts, they may be at different frequencies or be for different durations.

The transmitter circuit may be on a first substrate and the receiver may be on a second substrate electrically isolated from the first substrate.

The primary winding and the secondary winding desirably may be substantially planar windings arrange in a stacked arrangement with at least one of the windings substantially in or on one of the substrates. The primary winding then may be a bottom winding (closer to the substrate) and the secondary winding may be a top winding (further from the substrate). When the primary winding is a bottom winding, the isolator may further include a compensation network connected to the top winding for damping its response. Alternatively, the primary winding may be a top winding and the secondary winding may be a bottom winding.

According to another aspect of the invention, a bi-directional isolator is provided by including a second transmitter connected to drive said secondary winding in response to a second received logic signal, such that in response to a first type of edge in the second received logic signal, a signal of a third predetermined type is supplied to the secondary winding and in response to a second type of edge in the second received logic signal, a signal of a fourth predetermined type is supplied to said secondary winding, the secondary winding and the second transmitter being referenced to the second ground; and the primary winding being referenced to the first ground and said primary winding supplying to a second receiver circuit signals received in correspondence to the signals provided to the secondary winding, the second receiver reconstructing the second received logic signal. The isolator's second receiver may include circuitry for distinguishing between the signals received from the primary winding and using the distinguished received signals to reconstitute the second received logic signal. The signals from the first transmitter and the second transmitter may be similar or different.

According to another aspect, a digital logic isolator comprises a transformer having a primary winding referenced to a first ground and a secondary winding referenced to a second ground isolated from the first ground, means for providing to the primary winding signals of a first type in response to transitions of a first type in an input logic signal, means for providing to the primary winding signals of a second type different from the signals of the first type in response to transitions of a second type in the input logic signal, and means for receiving from the secondary winding signals corresponding to the signals of the first and second types and for reconstituting the input logic signal from them.

According to still anther aspect of the invention, a method of providing an isolated logic signal output in response to a logic signal input comprises providing a transformer having a primary winding referenced to a first ground and a secondary winding referenced to a second ground isolated from the first ground, providing to the primary winding signals of a first type in response to transitions of a first type in the input logic signal, providing to the primary winding signals of a second type different from the signals of the first type in response to transitions of a second type in the input logic signal, and receiving from the secondary winding signals corresponding to the signals of the first and second types and reconstituting the input logic signal from them.

The signals of a first type may comprise multiple pulses, the signals of the second type may comprise a single pulse and reconstituting the input logic signal may comprise distinguishing between the signals corresponding to said multiple pulses and the signals corresponding to said single pulses so as to provide an output signal reconstituting the transitions in the input logic signal. The signals of a first type or the signals of a second type comprise a burst. If both the signals of a first type and the signals of a second type comprise bursts, they may be distinguishable from each other by frequency, duration or other characteristic. A signal of the first type alternatively may comprise a pulse of a first duration and a signal of the second type may comprise a pulse of a second duration different from the first duration and distinguishable therefrom; and reconstituting the input logic signal may comprise distinguishing between received signals corresponding to the pulses of a first duration and the pulses of a second duration so as to provide an output signal reconstituting the transitions in the input logic signal.

According to another aspect of the invention, a logic isolator comprises a micro-transformer comprising, on a substrate, vertically stacked, a bottom winding and a top winding disposed over and insulated from the bottom winding, with a damping network connected across the top winding. A transmitter circuit receives a logic input signal and drives a signal to said bottom winding; and a receiving circuit is connected to receive from the top winding a signal corresponding to the signal driving the bottom winding and generates an output comprising a reconstituted logic input signal.

According to still another aspect, a logic isolator comprises a micro-transformer having, on a substrate, vertically stacked, a bottom winding and a top winding disposed over and insulated from the bottom winding; a damping network connected across the top winding; a transmitter circuit receiving a logic input signal and providing a transformer driving signal; a receiving circuit connected to receive from the transformer a signal corresponding to the driving signal and generating an output comprising a reconstituted logic input signal; and means for programming the isolator by coupling the driving signal to a selected one of the windings and coupling the receiving circuit to the other one of the windings. In such an isolator, the means for programming may comprise a fusible connection(s) programmed by blowing open a conductive path(s). The means for programming alternatively may comprise bond wires provided between the transformer windings on the one hand and the transmitter and receiving circuits, on the other hand. As a further alternative, the means for programming comprises programmable circuitry configurable to connect the transmitter circuit to either the top winding or the bottom winding and to connect the receiving circuit to the other winding. The programmable circuitry may include programmable switching circuits and a memory containing programming to control the switching circuits. The memory may be read-only memory.

According to yet another aspect, a logic isolator comprises a micro-transformer comprising, on a substrate, vertically stacked, a bottom winding and a top winding disposed over and insulated from the bottom winding; a damping network connected across the top winding; a first module coupled to the top winding capable of either receiving a logic input signal and providing a transformer driving signal or receiving from the transformer a signal corresponding to the driving signal and generating an output comprising a reconstituted logic input signal; a second module coupled to the bottom winding capable of either receiving a logic input signal and providing a transformer driving signal or receiving from the transformer a signal corresponding to the driving signal and generating an output comprising a reconstituted logic input signal; and means for programming the isolator such that the first module operates in the transformer drive mode while the second circuit operates in the receive mode or that the first module operates in the receive mode while the second module operates in the transformer drive mode. Various alternatives may be used as the means for programming. Such means may comprise, for example, at least one fusible connection programmed by blowing open at least one conductive path. As another example, the means for programming may comprise one or more bond wires provided between the transformer windings on the one hand and the first and second modules, on the other hand. The means for programming also may comprise programmable circuitry configurable to connect the first module to either the top winding or the bottom winding and to connect the second module to the other winding. Such programmable circuitry may include programmable switching circuits and a memory containing programming to control the switching circuits. The memory may include a read-only memory.

According to still another aspect, a dual-channel, bi-directional isolator comprises first and second micro-transformers arranged on a first substrate, each transformer having a top winding and a bottom winding. A first transmitter circuit is connected to drive the bottom winding of the first transformer; a second transmitter circuit is connected to drive the top winding of the second transformer. A first receiver circuit is connected to receive signals from the bottom winding of the second transformer. A second receiver circuit is connected to receive signals from the top winding of the first transformer. Preferably, but not necessarily, the first transmitter circuit and first receiver circuit are on the first substrate, and the second transmitter circuit and second receiver circuit are on a second substrate which is electrically isolated from the first substrate.

Yet another aspect of the invention is a single channel bi-directional isolator comprising a micro-transformer arranged on a first substrate, the transformer having a top winding and a bottom winding; a first transmitter circuit connected to drive the bottom winding; a second transmitter circuit connected to drive the top winding; a first receiver circuit connected to receive signals from the top winding; a second receiver circuit connected to receive signals from the bottom winding; and the first and second transmitter circuits transmitting so as to avoid interfering with each other. Preferably, but not necessarily, the first transmitter circuit and the second receiver circuit are on the first substrate and the second transmitter circuit and the first receiver circuit are on a second substrate which is electrically isolated from the first substrate.

According to still another aspect, there is provided a delay element for use in pulse generating circuits for generating pulses usable, for example, to drive a transformer as above-described. The delay element is useful for generating a delay interval, and therefore a pulse duration, of a length that is substantially independent of the supply voltage—i.e., is insensitive to variations in supply voltage. The delay element comprises first and second current sources which supply currents I1 and I2, respectively, in parallel, and a switching element. The sum of currents I1 and I2 is directly proportional to the supply voltage, and a threshold of the switching element is a predetermined portion of the supply voltage. The delay element may further include a capacitor of capacitance C, connected to a node in common with the input of the switching element and the current sources, chargeable by the current sources. Preferably, the first current source comprises a single transistor and a resistor, the resistor, of resistance value R, having one end connected to the supply voltage and the other end connected to said transistor. Current I1=(VDD−VT)/R, where the transistor is a MOS transistor, VT is the threshold voltage of the MOS transistor, VDD is the supply voltage, I2=VT/R, I1+I2=VDD/R. The delay interval is then approximately 0.5 RC if the switching threshold of the switching element is set to be VDD/2, and is relatively insensitive to changes in VDD. Such a delay element may be used in conventional pulse generating circuits that rely upon use of a delay element.

BRIEF DESCRIPTION OF THE DRAWINGS

Other objects, features and advantages will occur to those skilled in the art from the following description of a preferred embodiment and the accompanying drawings, in which:

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 7 is a waveform depicting two distinguishable pulses of different pulse width, such as may be used in an alternative embodiment of an isolator as taught herein;

FIG. 8 is a diagrammatic illustration of an isolator according to some aspects of the invention, wherein the primary winding is a top winding;

FIG. 10 is a diagrammatic illustration of an isolator according to some aspects of the invention, wherein the primary winding is a bottom winding;

FIG. 11 is a diagrammatic illustration of a bi-directional dual channel isolator such as may be implemented using the teachings herein;

DISCLOSURE OF THE PREFERRED EMBODIMENT

Figure 1:
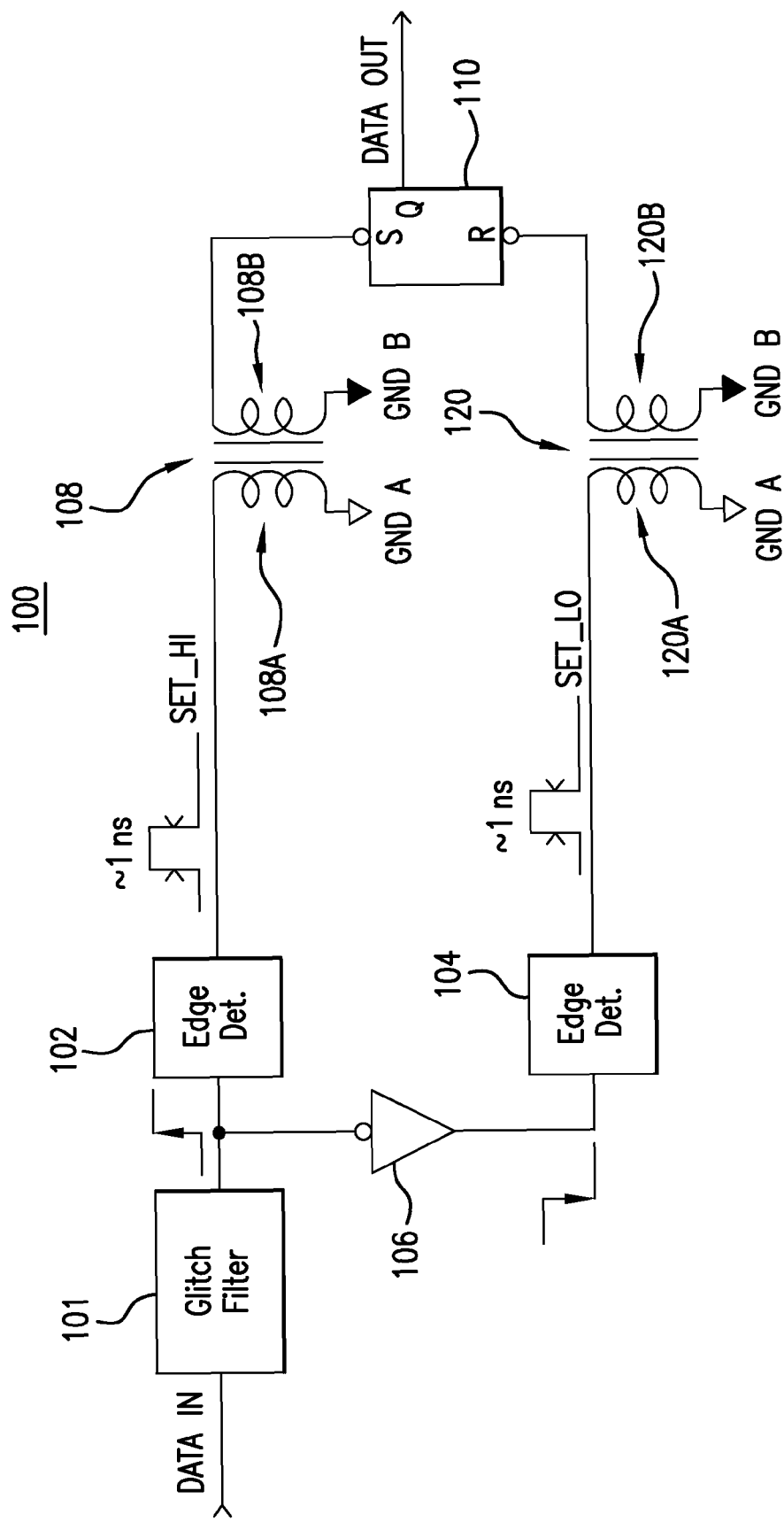
FIG. 1 is a simplified schematic circuit diagram of a transformer-based isolator according to the prior art.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Micro-transformer based digital isolators have been developed in recent years by applicants and their colleagues. This genus of digital isolators shows dramatic improvements over traditional opto-isolators in terms of speed, power, edge symmetry and cost. The transmission methods employed in these micro-transformer based digital isolators fall into two main categories. The first category is based on edge detection; the second, on level detection. Those designs that are based on edge detection have the advantage of lower power, lower pulse width distortion and higher common mode transient immunity over those based on level detection. Typically, implementations based on edge detection require two transmitters, two receivers and two transformers to make a single channel isolator. A need exists for a less expensive design.

As shown herein, a digital isolator may be formed, which is based on a micro-transformer-created isolation barrier, using only a single transmitter, a single receiver and a single transmitter. This approach dramatically reduces the die cost while still preserving the merits of edge detection. Further, in a vertically stacked arrangement of micro-transformer windings, the present invention enables bi-directional signal transfer. That is, the signal can be transferred from the top coil to the bottom coil or from the bottom coil to the top coil. This capability can be leveraged to make bi-directional, multi-channel signal isolators or to program the channel direction of a single data channel. This invention preserves the main advantages of high speed, low power, high common-mode immunity and adds to them a reduction in size and enhanced ease of integration.

By the term "micro-transformer," there is meant transformer formed in, partially in, or on, a semiconductor substrate of flat, parallel conductive windings and having no magnetic core. These transformers are also referred to as "air-core" transformers though there actually will be more than air between the windings, typically one or more layers of dielectric materials.

A block diagram of a typical prior art example of a transformer-based isolator for digital signals is shown in FIG. 1. There, the isolator 100 comprises (after an optional, though preferable, glitch filter 101), a pair of edge detectors 102 and 104, edge detector 104 being driven by the logical complement to the signal driving edge detector 102, by means of inverter 106. The output of edge detector 102 provides a pulse, the SET_HI signal to the primary winding of transformer 108 responsive to detection of a low-to-high transition (i.e., a leading edge) in the output of the glitch filter 101. The secondary winding of transformer 108 is connected to the set input of a flip-flop 110. The output of edge detector 104 is a pulse named the SET_LO signal which is supplied to the primary winding 120A of transformer 120 responsive to detection of a high-to-low transition (i.e., a falling edge) in the output of the glitch filter 101. The secondary winding of transformer 120 is supplied to the reset input of flip-flop 110. Typically, though not shown for the sake of avoiding obfuscation, the connection from each transformer secondary winding to the flip-flop 110 is not direct, but is made through a Schmitt trigger or other waveform-shaping circuitry intended to provide clean, fast transitions to the flip-flop.

Note that the primary windings 108A and 120A of transformers 108 and 120, respectively, as well as the glitch filter and the two edge detectors, are connected (referenced) to a first electrical ground, GNDA, while the secondary windings 108A and 120B, together with the flip-flop 110, are referenced to a second electrical ground, GNDB, which is isolated from the first ground.

The outputs of the edge detectors 102 and 104 comprise encoded leading edge and falling edge indicators. These indicators may be in the form of pulses, short bursts, or any periodic signal. So, the edge detectors may be monostable multivibrators, differentiators or other suitable circuits. In the illustration, a single pulse of about 1 ns duration is shown as an edge indicator signal.

Figure 2:
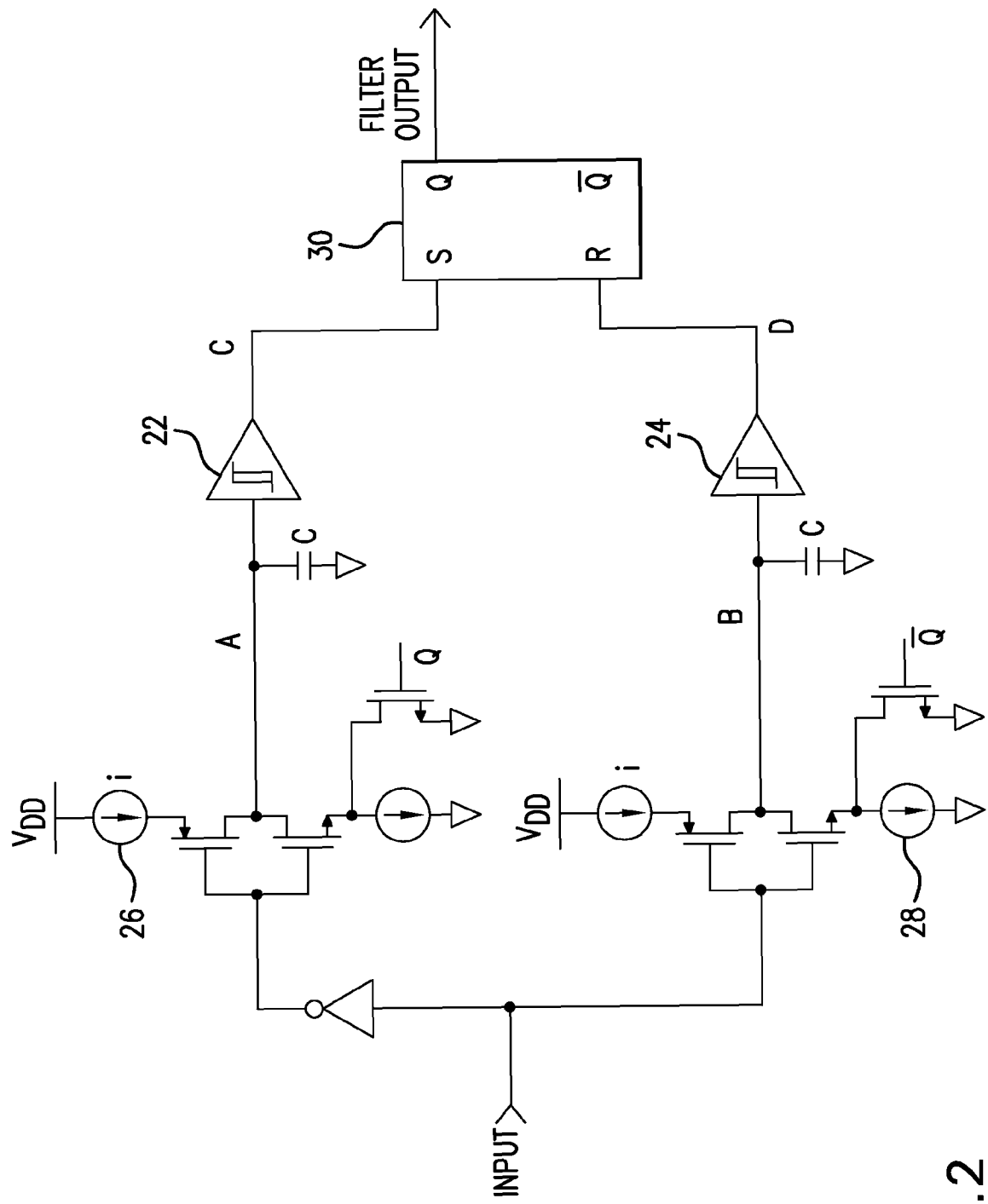
FIG. 2 is a simplified schematic circuit diagram of a glitch filter for use in an isolator according to the invention.
Figure 3:
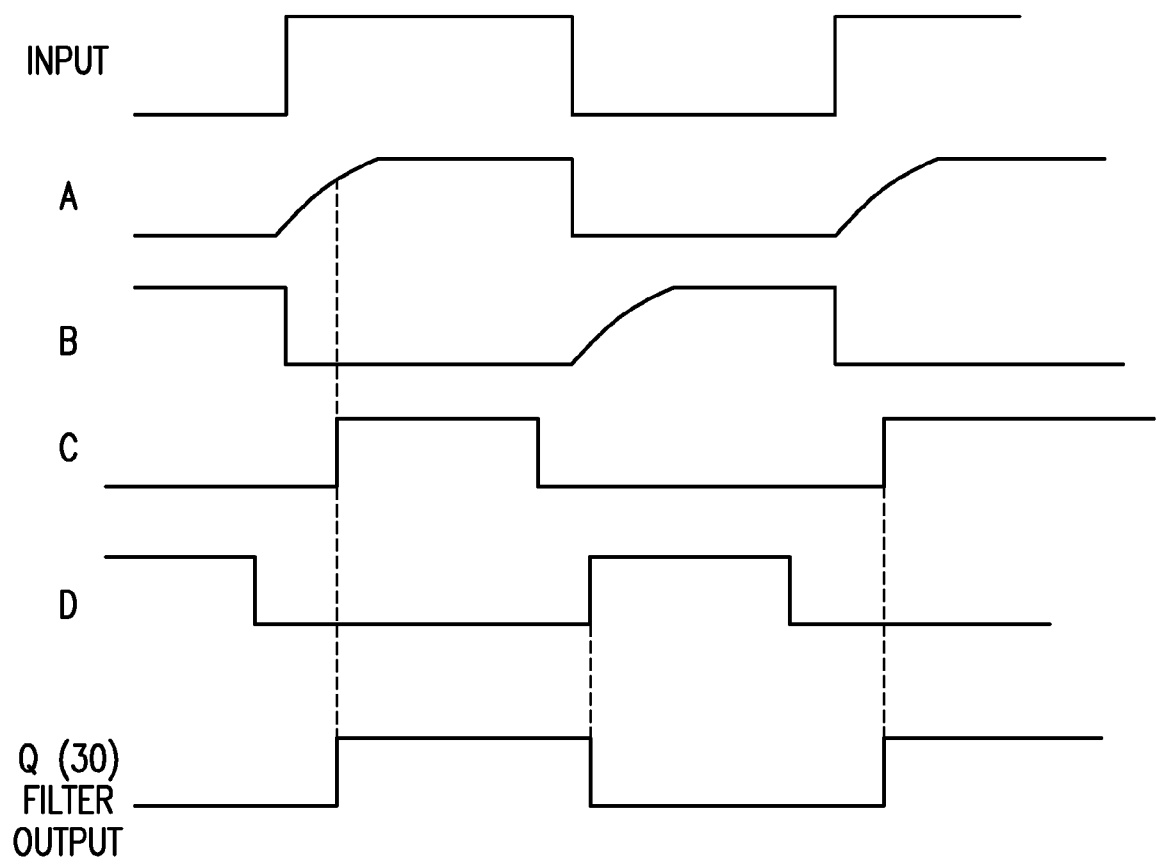
FIG. 3 is a set of waveforms for the circuit of FIG. 2.

Glitch filter 101 may be of any suitable design. A brick wall filter is typical. Typically, it should have a bandwidth larger than that to which the edge detectors respond. FIG. 2 provides a schematic circuit diagram for a usable filter, corresponding timing diagrams showing the waveforms at the input, nodes A-D and the filter output being provided in FIG. 3. The filtered pulse width is given approximately by CVthreshold/i, where Vthreshold is the threshold voltage of the Schmitt triggers 22 and 24 and i is the current from current sources 26, 28.

Figure 4:
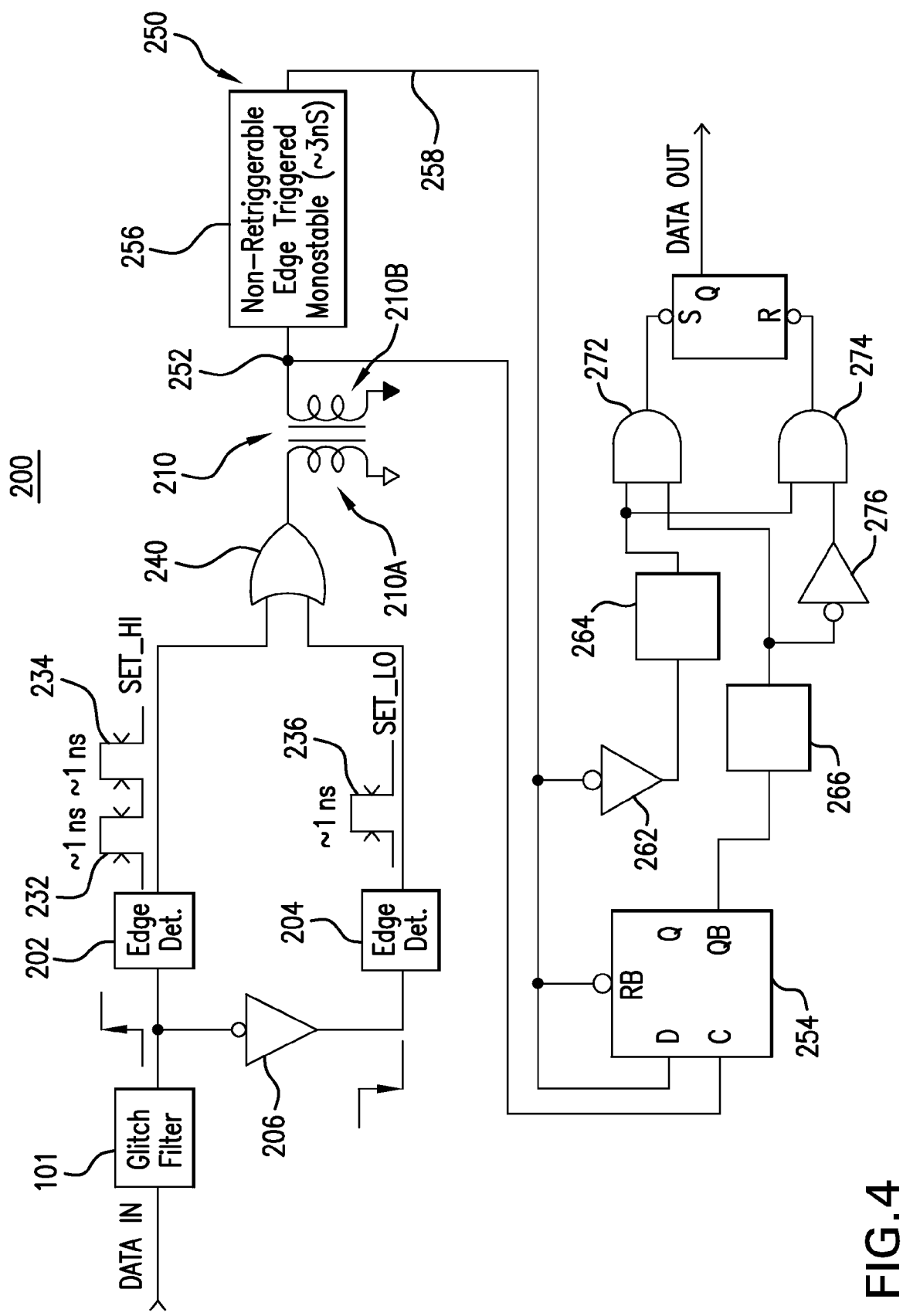
FIG. 4 is a simplified schematic circuit diagram of a first embodiment of a transformer-based isolator embodying aspects taught herein.

Turning now to FIG. 4, a basic embodiment for practicing the present invention is shown. FIG. 4 illustrates a logic signal isolator 200 in which encoded leading and falling edge indicators from a pair of edge detectors 202 and 204 (corresponding to edge detectors 102 and 104 of FIG. 1) are sent to a single transformer 210. Unlike the above-discussed design, however, the leading edge and falling edge indicators are encoded as different, distinguishable signals. That is, the SET_HI signal output from leading edge detector 202 is distinct from the SET_LO signal output from falling edge detector 204. The receiving side circuitry connected to the secondary winding 210B of transformer 210 (again, typically via a Schmitt trigger or other suitable wave-shaping circuit, not show) then reconstructs the logic edges based on distinguishing between those two signals.

An example is illustrated wherein edge detector 202 produces two consecutive short pulses 232 and 234 as a leading edge indicator and edge detector 204 produces only a single pulse 236 as a falling edge indicator. The pulses 232 and 234 preferably have a known, fixed spacing between them. If transformer 210 is a high bandwidth micro-transformer, the pulse widths may be as narrow as 1 ns or even less. The outputs of edge detectors 202 and 204 are combined by and OR gate 240, to drive the primary winding 210A of the transformer. The pulses cannot be so short or weak in amplitude that the OR gate will not respond properly.

Of course, the concept is to use two different, distinguishable signals. They need not be a single pulse and a double pulse. For example, a narrow pulse (e.g., 1 ns) could be used as one edge indicator and a wider pulse (e.g., 2 ns) could be used as the other edge indicator. It is only necessary that the receiver be able to distinguish the two signals. The concept lends itself to the use of other distinguishable signals but at the same time, one would not wish to use an unnecessarily complicated arrangement or one which would add any significant delay in signal processing. For signals other than those illustrated, it might be necessary to replace OR gate 240 with other elements that would effectively combine the outputs of the edge detectors into a single signal for driving the transformer.

The two pulses in the SET_HI signal have a known, fixed spacing between them. The total duration of the two pulses and the intervening gap between them in the SET-HI signal, if sufficiently short with respect to the shortest interval between two leading edges in the input signal, will permit resolution between the SET-HI and SET_LO pulses.

A receiver circuit 250, connected to secondary winding 210B, recovers the output of transformer 210, distinguishes between the SET_HI and SET_LO pulses, and reconstructs the input logic signal as a data out signal. More specifically, the received pulses at node 252 clock a D-type flip-flop 254 and also act as the input to a non-retriggerable edge-triggered mono-stable multivibrator 256. The multivibrator 256 puts out a pulse on line 258 that is of duration at least as long as the combination of pulse 232 and the interval between pulse 232 and pulse 234 in the SET_HI signal. If the two pulses 232 and 234 are each approximately 1 ns in duration and the interval between them is of like duration, then the pulse on line 258 should be at least about 2 ns long; 3 ns is used in this example to allow some "hold" time to facilitate clocking of flip-flop 254. Line 258 connects to the D input of flip-flop 254, to the reset input of that flip-flop and to the input of inverter 262. The output of inverter 262 is connected to the input of an edge detector 264 and the QB output (the complementary output) of flip-flop 254 is connected to the input of another edge detector 266. The output of edge detector 264 is connected to one input of each of AND gates 272 and 274. The output of edge detector 266 is connected to the second input of AND gate 272 and through inverter 276 to the second input of AND gate 274. In turn, the output of AND gate 272 is connected to the set input of set/reset flip-flop 278 and the output of AND gate 274 is connected to the reset input of flip-flop 278. The DATA OUT signal, corresponding to an isolated and slightly delayed version of the DATA IN signal received by the glitch filter, appears at the Q output of flip-flop 278.

Figure 5:
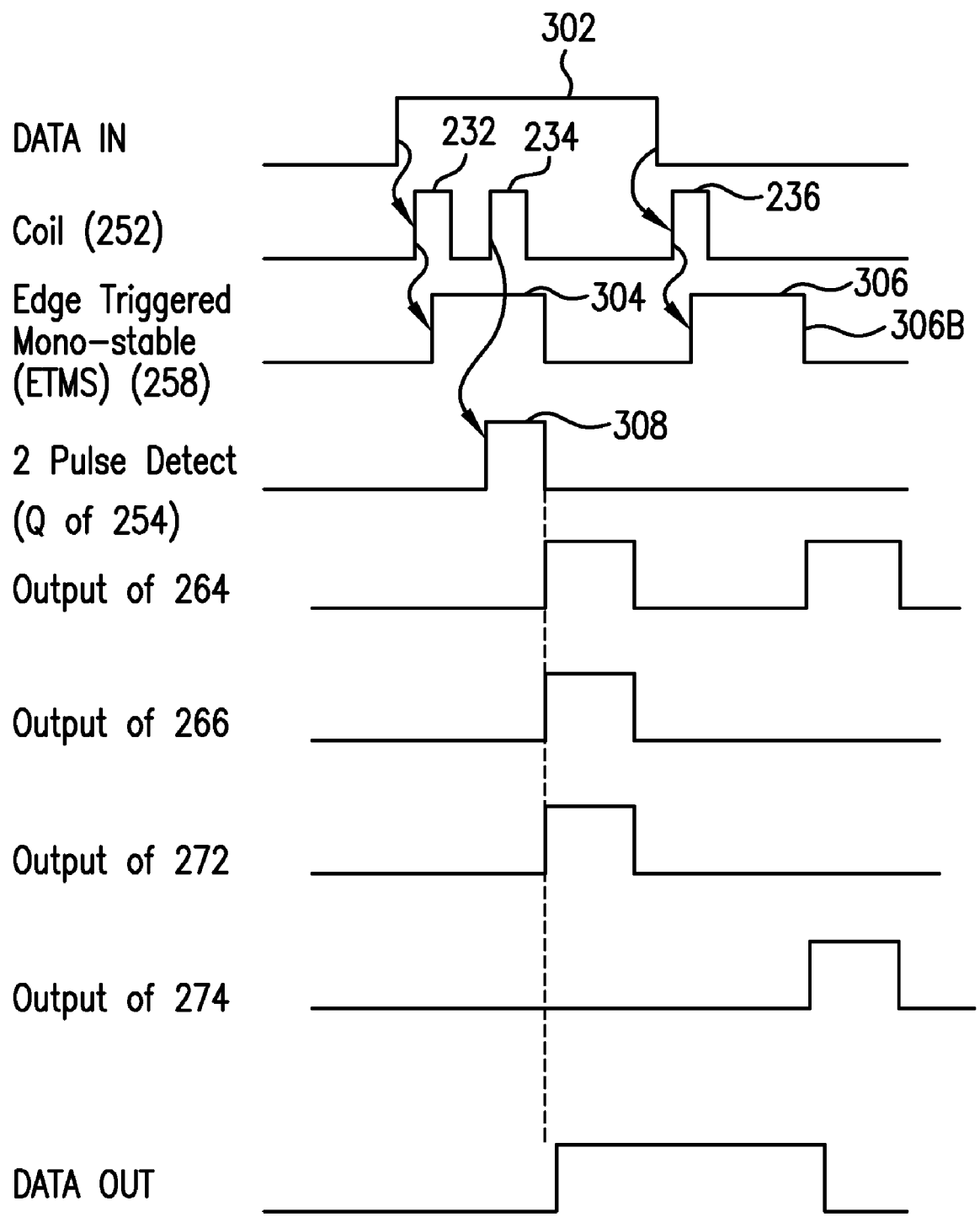
FIG. 5 is a set of waveforms for the circuit of FIG. 4.

The operation of this circuit will now be explained with reference to the waveforms of FIG. 5. Assume that the DATA IN input has the waveform 302. At node 252, the COIL signal is received. Pulses 232 and 234 have been generated by edge detector (i.e., transmitter) 202 in response to the leading, positive-going edge of the input signal and pulse 236 has been generated by edge detector 204 in response to the negative-going, trailing edge of the input signal. The edge-triggered mono-stable (ETMS) multivibrator 256 generates an output waveform on line 258 as shown at ETMS. In the ETMS signal, the leading edge of pulse 232 causes the pulse 304 to be generated. The multivibrator 256 does not do anything in response to the falling edge of pulse 232 or to either edge of the second pulse 234. Only after pulse 304 has been output is the multivibrator 256 able to respond to a new input, which it does when it receives the leading edge of pulse 236. Detection of the leading edge of pulse 236 causes the outputting of pulse 306.

The second of the two initial pulses, pulse 234, is detected and the output signal is formed as follows. When the first pulse 232 clocks the flip-flop 254, the D input of the flip-flop still sees a low output from the edge-triggered mono-stable multivibrator on line 258. That means the QB output of the flip-flop 254 is set to a high value and the Q output is set to a low value. When the second pulse 234 is received and clocks flip-flop 254, the output of the edge-triggered mono-stable is now high and the QB output of flip-flop 254 transitions to a low value, meaning that the Q output of flip-flop 254 goes high as at the leading edge of the pulse 308 in the "2 Pulse Detect" signal on FIG. 5. This H-L edge is sensed by edge detector 266, which produces a pulse 310 to the second (bottom) input of AND gate 272. The output of the edge-triggered mono-stable is also supplied to the input of inverter 262. So, after the propagation delay through inverter 262, edge detector 264 sees a high-to-low transition (edge) at the output of inverter 262 and responsively generates a positive-going pulse 312 to the first (top) input of AND gate 272 and to a first (top) input of AND gate 274. Inverter 262 is designed to have a propagation delay that is substantially equal to that from the D input to the QB output of flip-flop 254. Hence, edge detectors 264 and 266 produce substantially concurrent output pulses 310 and 312 to AND gate 272. As a result, the output 314 of AND gate 272 goes from low to high at the same time and sets the set (S) input of the SR flip-flop 278; and the Q output thereof, being the DATA OUT signal, goes high. As the second (bottom) input of AND gate 274 is responsive to the output of edge detector 266 through inverter 276, the first and second pulses have no impact on the output of AND gate 274 and do not affect the output of flip-flop 278. However, when third pulse 236 triggers edge-triggered mono-stable 256, to produce its second output pulse 306, this results as stated above, in the generation of a pulse at the output of edge detector 264 upon the falling edge of the mono-stable output pulse. The second input of AND gate 274 from inverter 276 will be high at this time because the only time it is low is when the output of edge detector 266 generates the second pulse detection signal 308. Therefore, the reset (R) input of flip-flop 278 sees the output pulse 316 from AND gate 274 upon the falling edge of the output pulse from edge detector 264 (plus propagation delay), and flip-flop 278 is reset and the DATA OUT signal goes low.

Figure 6:
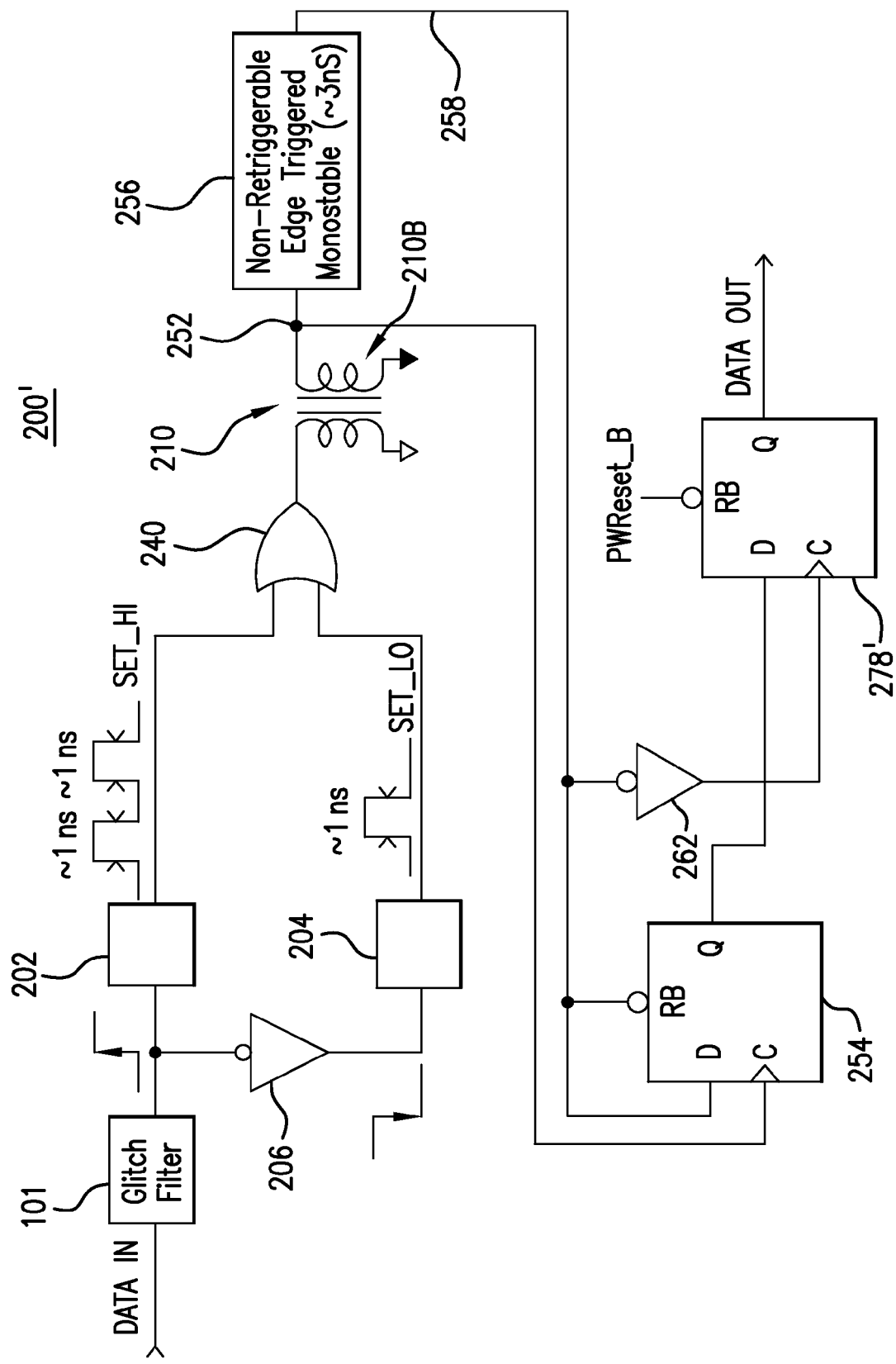
FIG. 6 is a simplified schematic circuit diagram of a second embodiment of a transformer-based isolator embodying aspects taught herein.

An alternative embodiment 200' for the pulse receiver circuitry is shown in FIG. 6. Edge detectors 264, 266 and gates 272, 274 and 276 have been eliminated and the output flip-flop 278' is changed from a set-reset flip-flop to a D-type flip-flop. Again, the first pulse 232 clocks flip-flop 254 before the edge-triggered mono-stable 256 has generated an output pulse on the D input of flip-flop 278'. Therefore, the Q output of flip-flop 254 assumes a low state. When the second pulse 234 clocks flip-flop 254, the D input thereof now sees the output pulse 304 from the edge-triggered mono-stable and the Q output of flip-flop 254 transitions to a high value. The falling edge of the mono-stable pulse 304 is coupled to the clock input of flip-flop 278' through inverter 262, and clocks flip-flop 278'; as a result, the high value from the Q output of flip-flop 254 supplies a high value on the Q output of flip-flop 278', and the DATA OUT signal. The falling edge of the mono-stable output pulses also reset flip-flop 254 via its RB (i.e., R complement) input. The output flip-flop 278' is next clocked, again, by the falling edge of the output pulse from the mono-stable, being edge 306B, of pulse 306 generated in response to the third pulse, 236, on the transformer. At the time of edge 306B, flip-flop 254 has been reset to have a low output and the output of flip-flop 278' accordingly goes low.

To assure proper operating states, a reset signal termed PWReset_B is supplied to the reset (complement) input of flip-flop 278' and causes flip-flop 278' to be reset whenever device power is reset.

An alternative signaling arrangement, mentioned above, is shown in FIG. 7. There, instead of using two pulses to indicate a rising edge and one pulse to indicate a falling edge in the input signal, a double-width pulse 350 is used to indicate a rising edge and a single-width pulse 360 is used to indicate a falling edge. Those skilled in the art of electrical engineering will readily be able to device logic circuitry to discriminate between a pulse of single width duration Δ and a pulse of double width duration 2Δ.

An exemplary physical implementation for an isolator according to the present invention, capable of being packaged in an integrated circuit form, is shown in FIG. 8. There, a transmitter (or driver) circuit 802 is formed on a first substrate 804. A transformer comprising a first winding 806A and a second winding 806B is formed on a second substrate 808, along with a receiver circuit 810. Wire leads 812A, 812B from bond pads 814A and 814B on substrate 804 connect the driver output to the primary winding 806A of the transformer. As shown there, obviously, the primary (driving) coil winding is the top coil 806A and the secondary (receiving) coil winding is the bottom coil 806B. It is important to note that the two coils, even if made in the same dimensions and geometry, will exhibit different quality factor Q, because the bottom coil has higher capacitance to substrate 808.

Figure 9A:
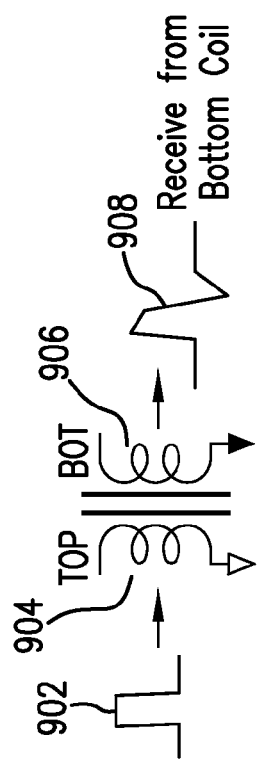
FIG. 9 is an illustration of input and output waveforms when driving a micro-transformer of the type preferably employed in implementing embodiments of the isolators taught herein, particularly illustrating the difference between driving top and bottom transformer windings.
Figure 9B:
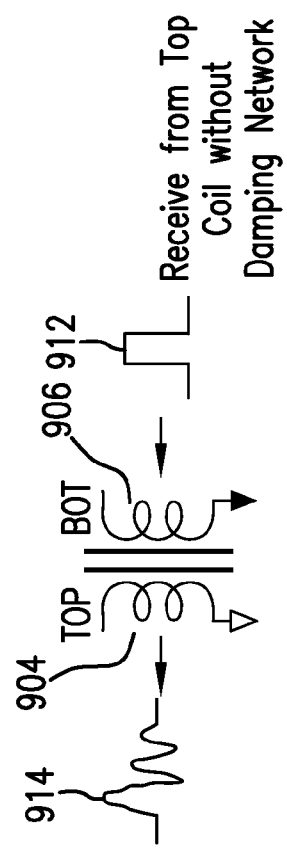
Figure 9C:
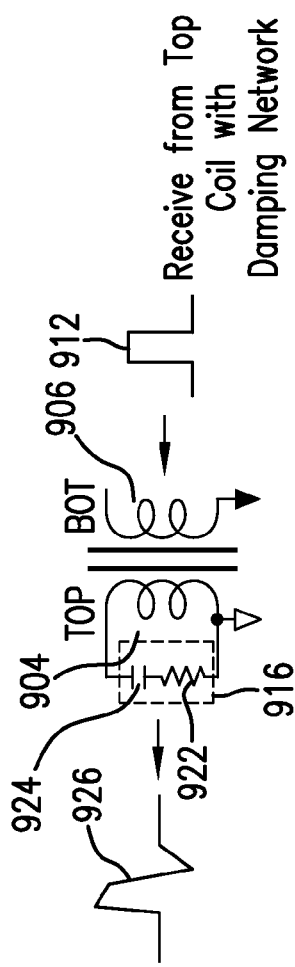

Referring to FIG. 9A, when an idealized square voltage pulse 902 drives the top winding 904 of such a transformer, the voltage received at the bottom winding 906 will exhibit a waveform something like 908. By contrast, if the bottom coil 906 is driven by the idealized pulse 912 as shown in FIG. 9B, then the received voltage waveform at the top coil 904 will typically be as shown at 914, exhibiting ringing due to the fact that the top coil has a higher Q than the bottom coil. This undesired ringing makes it difficult to use the transformer for bi-directional signal transfer. However, bi-directional signal transfer is desired in at least some embodiments of the present invention and it is possible to establish a greater degree of symmetry as shown in FIG. 9C, by adding a damping network 916 on the receiving top coil. The damping network consists of a resistor 922 and a capacitor 924 in series. Damping with a resistor only would dramatically reduce the received signal and typically would not be acceptable. The capacitor 924 has very low impedance at high frequencies and blocks DC current through the damping resistor, providing the desired response characteristics. Note that with the damping network, the received waveform 926 from the top coil is substantially the same as the received waveform from the bottom coil as shown at 908 in FIG. 9A.

Through use of such a damping network, the edge-detection based isolator above described can be implemented as pictured in FIG. 10. There, it can be seen that the primary coil is the bottom coil 906 instead of the top coil 904.

A bi-directional dual isolator arrangement as shown in FIG. 11 is thus enabled. This bi-directional isolator has a pair of stacked transformers arranged side by side. A first transformer is formed by the windings 1102A and 1102B, while a second transformer is formed by the windings 1104A and 1104B. Only one substrate 1106 carries the transformer structure because the primary winding now can be the top coil or bottom coil of a transformer. Absent this possibility, each of the two substrates 1106 and 1108 would need to have an isolated transformer structure thereon and the product would be considerably more expensive to make.

Alternatively, it is possible to make a single channel bi-directional isolator having only one vertically stacked transformer, with one transmitter driving the transformer while the other transmitter is idled. Synchronization of the transmissions in two directions can be programmed externally or through proper command encoding/decoding.

For some applications, where bandwidth and data rate are not paramount considerations, instead of using pulses to drive the transformer primaries, other signals such as analog bursts at predetermined frequencies and of predetermined durations may be employed. In such situations, signals can be transmitted bi-directionally concurrently through a single transformer.

Advantageously, single- and multiple-channel isolators can be manufactured so that the selection of configuration (i.e., which channels transmit in which directions) can be made in final assembly and test steps of production. That lowers product cost by allowing one product core to be made and sold for multiple configurations. The designs shown above lend themselves to this approach in one of two ways. In a first approach, a logic isolator comprises a micro-transformer having, on a substrate, vertically stacked, a bottom winding and a top winding disposed over and insulated from the bottom winding; a damping network connected across the top winding; a transmitter circuit receiving a logic input signal and providing a transformer driving signal; a receiving circuit connected to receive from the transformer a signal corresponding to the driving signal and generating an output comprising a reconstituted logic input signal; and means for programming the isolator by coupling the driving signal to a selected one of the windings and coupling the receiving circuit to the other one of the windings. In general, the programming would have to be effected before final testing of the isolator in order to maintain isolation between input and output. In such an isolator, the means for programming may, for example, comprise a fusible connection(s) programmed by blowing open a conductive path(s). The means for programming alternatively may comprise bond wires provided between the transformer windings on the one hand and the transmitter and receiving circuits, on the other hand. In either instance, the isolator cannot be tested until isolation-destroying paths are blown open or isolation-destroying bond wires are removed (if there had been any); of course, bond wires could selectively be installed as the last step in manufacture, before testing. As a further alternative, the means for programming may comprise programmable circuitry configurable to connect the transmitter circuit to either the top winding or the bottom winding and to connect the receiving circuit to the other winding. Again, however, only one set of valid connections can be established if input-output isolation is to be maintained. The programmable circuitry may include programmable switching circuits and a memory containing programming to control the switching circuits. The memory may be read-only memory. A second approach may be based on providing modules, each having both a transformer-driving circuit (i.e., transmitter) and a receiver circuit, such that the module is configured to operate only as a driving circuit or only as a receiving circuit, configuring done at final assembly or by the user. In this approach, a logic isolator comprises a micro-transformer having, on a substrate, vertically stacked, a bottom winding and a top winding disposed over and insulated from the bottom winding; a damping network connected across the top winding; a first module coupled to the top winding capable of either receiving a logic input signal and providing a transformer driving signal or receiving from the transformer a signal corresponding to the driving signal and generating an output comprising a reconstituted logic input signal; a second module coupled to the bottom winding capable of either receiving a logic input signal and providing a transformer driving signal or receiving from the transformer a signal corresponding to the driving signal and generating an output comprising a reconstituted logic input signal; and means for programming the isolator such that the first module operates in the transformer drive mode while the second circuit operates in the receive mode or that the first module operates in the receive mode while the second module operates in the transformer drive mode. Various alternatives may be used as the means for programming. Such means may comprise, for example, at least one fusible connection programmed by blowing open at least one conductive path. As another example, the means for programming may comprise one or more bond wires provided between the transformer windings on the one hand and the first and second modules, on the other hand. The means for programming also may comprise programmable circuitry configurable to connect the first module to either the top winding or the bottom winding and to connect the second module to the other winding. Such programmable circuitry may include programmable switching circuits and a memory containing programming to control the switching circuits. The memory may include a read-only memory.

Utilizing these approaches, a dual-channel, bi-directional isolator comprises first and second micro-transformers arranged on a first substrate, each transformer having a top winding and a bottom winding. A first transmitter circuit is connected to drive the bottom winding of the first transformer; a second transmitter circuit is connected to drive the top winding of the second transformer. A first receiver circuit is connected to receive signals from the bottom winding of the second transformer. A second receiver circuit is connected to receive signals from the top winding of the first transformer. Preferably, but not necessarily, the first transmitter circuit and first receiver circuit are on the first substrate, and the second transmitter circuit and second receiver circuit are on a second substrate which is electrically isolated from the first substrate.

Similarly, a single channel bi-directional isolator comprising a micro-transformer arranged on a first substrate, the transformer having a top winding and a bottom winding; a first transmitter circuit connected to drive the bottom winding; a second transmitter circuit connected to drive the top winding; a first receiver circuit connected to receive signals from the top winding; a second receiver circuit connected to receive signals from the bottom winding; and the first and second transmitter circuits transmitting so as to avoid interfering with each other. Preferably, but not necessarily, the first transmitter circuit and the second receiver circuit are on the first substrate and the second transmitter circuit and the first receiver circuit are on a second substrate which is electrically isolated from the first substrate.

Figure 12:
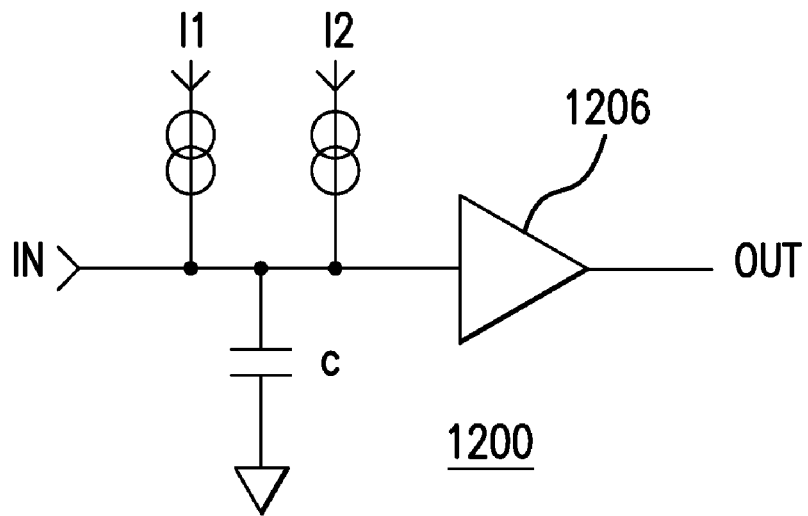
FIG. 12 is a simplified schematic circuit diagram for a supply-independent delay element for use in a pulse generator (transmitter) in isolators such as are taught herein.
Figure 13:
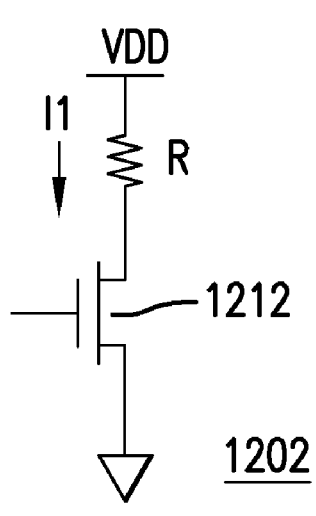
FIGS. 13 and 14 are simplified schematic circuit diagrams for current sources for use in the delay element of FIG. 12.

Such isolators typically have to work with a wide range of supply voltage. If such a characteristic is desired, and the driving signals are to be pulses, then it is also necessary that the transmitters (i.e., edge detectors or pulse generators of whatever nature) be able to generate pulses of precise, voltage-independent pulse width. Methods to generate such voltage-independent pulse widths will now be discussed. A delay element typically is required in such pulse generators. And as illustrated schematically in FIG. 12, a delay element 1200 comprises two current sources 1202 and 1204 which supply currents I1 and I2, respectively, one capacitor, C, and one switching element such as an inverter or a Schmitt trigger 1206. The sum of currents I1 and I2 is such that it is directly proportional to the supply voltage, and the switching threshold is half or some other constant portion of the supply voltage. A simplified example of a current source 1202 for generating current I1 is shown in FIG. 13. There, current source 1202 comprises a single transistor 1212 and a resistor R. The resistor R has one end connected to the supply voltage VDD and the other end connected to the drain of transistor 1212.

Figure 14:
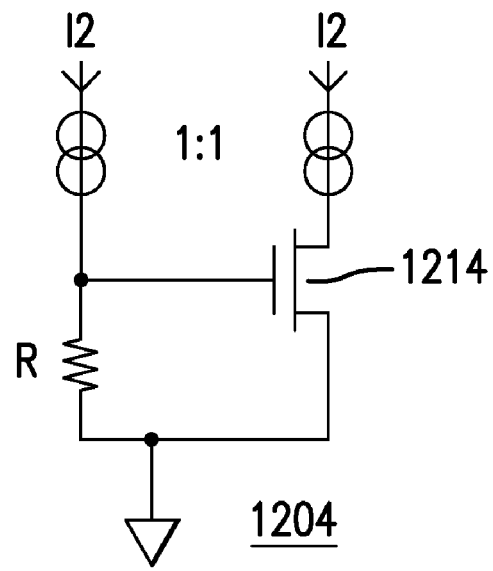

Current I1=(VDD−VT)/R, where VT is the threshold voltage of the MOS transistor 1212. Current I2=VT/R, I1+I2=VDD/R. Consequently, the delay time will be 0.5 RC if the switching threshold is set to be VDD/2. Current source 1204 for generating current I2 can be easily implemented. For example, a simplified schematic circuit diagram for such a current source is shown in FIG. 14. Transistor 1214 imposes the voltage VT across resistor R, inducing current I2 and that current is mirrored in the drain path of transistor 1214.

The delay element 1200 can be easily used to generate pulses whose width is independent of the supply voltage.

Of course, the illustrated design need not be used to form the required current source. Any design can be used that will produce a supply-independent pulse width. In the examples shown, this is achieved by adding a first current that is proportional to the supply voltage to a second current that is inversely proportional to the supply voltage. Other approaches are not ruled out.

Having discussed the principles involved and having illustrated multiple embodiments, it will be further apparent that various alterations thereto and additional embodiments will occur to those skilled in the art. Any such alterations, amendments, improvements and additional embodiments are intended to be within the spirit and scope of the invention, which is not limited by the foregoing examples but only as required by the appended claims and equivalence thereto.

What is claimed is:

1. A method for providing an isolated logic output signal, comprising:
    in response to receiving an input data signal, generating an edge detection signal indicating a rising or falling edge of the received input data signal;
    transforming the edge detection signal from a first voltage to a second voltage;
    inputting the transformed edge detection signal to a first input of a first logic circuit and to an input of a signal generator;
    outputting from the signal generator a logic signal to a second and third input of the first logic circuit, wherein the logic signal is representative of a duration of the edge detection signal; and
    in response to an output from the first logic signal, generating an isolated logic output signal.

2. The method of claim 1, further comprising:
    in response to receiving the transformed edge detection signal at the first input of the first logic signal, outputting from the first logic circuit a logic signal, wherein the first logic circuit is a flip-flop circuit.

3. The method of claim 1, further comprising:
    applying the logic signal output from the first logic circuit to a first edge detection circuit and applying an inverted representation of the logic signal output from the signal generator to a second edge detection circuit.

4. The method of claim 3, further comprising:
    applying the outputs of the first edge detection circuit and the second edge detection circuit to respective inputs on a pair of logic gates;
    outputting a logic signal from one of the pair of logic gates; and generating the isolated logic output signal in response to the respective one of the pair of logic gates that outputs the logic signal.

5. The method of claim 1, further comprising:

applying a logic signal output from the first logic circuit to a first input of a second logic circuit and applying an inverted representation of the logic signal output from the signal generator to a second input of the second logic circuit; and generating the isolated logic output signal based on the applied logic signal to the first input of the second logic circuit.

6. The method of claim 1, wherein the transforming comprises:

applying the edge detection signal at the first voltage to a primary winding of a transformer, and outputting from a second winding of the transformer the transformed edge detection signal at the second voltage.

7. A logic signal isolator comprising:

a transformer having a primary winding and a secondary winding;

a transmitter circuit for driving the primary winding in response to a received input logic signal;

a signal generating circuit that responds to a transformed voltage present on the secondary winding of the transformer by generating a logic signal;

a first logic circuit having inputs for receiving the generated logic signal and the transformed voltage present on the secondary winding of the transformer, and having an output for outputting a first logic circuit signal, and a second logic circuit having inputs for receiving signals generated in response to the first logic circuit signal and an output for outputting an isolated logic signal.

8. The logic signal isolator of claim 7, further comprising:

a first edge detection circuit connected between the output of the first logic circuit and a first input of the second logic circuit; and a second edge detection circuit connected between an output of the signal generating circuit via an inverter and a second input to the second logic circuit.

\* \* \* \* \*